United States Patent
Lam et al.

(10) Patent No.: US 10,826,529 B2
(45) Date of Patent: Nov. 3, 2020

(54) PARALLEL LDPC DECODER

(71) Applicant: Hong Kong Applied Science and Technology Research Institute Co., Ltd., Shatin, New Territories (HK)

(72) Inventors: Hing-Mo Lam, Tseung Kwan O (HK); Syed Mohsin Abbas, Sai Kung (HK); Zhuohan Yang, Ma On Shan (HK); Zhonghui Zhang, Shatin (HK); Man-Wai Kwan, Shatin (HK); Ching-Hong Leung, Tai Po (HK); Kong-Chau Tsang, Kowloon (HK)

(73) Assignee: Hong Kong Applied Science and Technology Research Institute Co., Ltd., Shatin (HK)

( * ) Notice: Subject to any disclaimer, the term of this patent is extended or adjusted under 35 U.S.C. 154(b) by 13 days.

(21) Appl. No.: 16/264,161

(22) Filed: Jan. 31, 2019

(65) Prior Publication Data

US 2020/0252080 A1    Aug. 6, 2020

(51) Int. Cl.
*H03M 13/11* (2006.01)

(52) U.S. Cl.
CPC ...... *H03M 13/1134* (2013.01); *H03M 13/112* (2013.01)

(58) Field of Classification Search
CPC ............. H03M 13/112; H03M 13/116; H03M 13/1134; H03M 13/1165
See application file for complete search history.

(56) References Cited

U.S. PATENT DOCUMENTS

| | | |
|---|---|---|
| 5,650,781 A | 7/1997 | Park |
| 7,814,393 B2 | 10/2010 | Kyung et al. |

(Continued)

FOREIGN PATENT DOCUMENTS

| | | |
|---|---|---|
| CN | 1454347 A | 11/2003 |
| CN | 107370489 A | 11/2017 |

(Continued)

OTHER PUBLICATIONS

Tsatsaragkos et al., A reconfigurable LDPC decoder optimized for 802.11 n/ac applications, Jan. 2018, IEE Trans. on VLSI systems, vol. 26, No. 1., pp. 182 to 195. (Year: 2018).*

(Continued)

*Primary Examiner* — Shelly A Chase
(74) *Attorney, Agent, or Firm* — Norton Rose Fulbright US LLP

(57) ABSTRACT

Systems and methods providing low-density parity-check (LDPC) decoder configurations capable of decoding multiple code blocks in parallel are described. Parallel LDPC decoders of embodiments can be reconfigured to simultaneously decode multiple codewords with reconfigurable size. In operation of embodiments of a parallel LDPC decoder, a plurality of active portions of the decoder logic are configured for parallel processing of a plurality of code blocks, wherein each active region processes a respective code block. The decoder logic active portions of embodiments are provided using a reconfigurable segmented scalable cyclic shifter supporting multiple instruction, multiple data (MIMD), wherein multiple individual different data shifts are implemented with respect to a plurality of code blocks in an instance of data shifting operation. Multiple data shift commands may be utilized such that the plurality of code blocks have an individual shifting command to thereby implement different data shifting with respect to each code block.

26 Claims, 16 Drawing Sheets

(56) References Cited

U.S. PATENT DOCUMENTS

| | | | |
|---|---|---|---|
| 8,612,835 B2* | 12/2013 | Yokokawa | H03M 13/1137 714/758 |
| 8,713,399 B1 | 4/2014 | Tsatsaragkos et al. | |
| 8,739,001 B2 | 5/2014 | Tsatsaragkos et al. | |
| 9,112,530 B2 | 8/2015 | Gunnam et al. | |
| 9,537,510 B2 | 1/2017 | Motozuka et al. | |
| 9,933,996 B2 | 4/2018 | Chaudhuri | |
| 2009/0274138 A1 | 11/2009 | Glickman et al. | |
| 2015/0229330 A1 | 8/2015 | Motozuka et al. | |

FOREIGN PATENT DOCUMENTS

| | | |
|---|---|---|
| WO | WO-2018029633 A1 | 2/2018 |
| WO | WO-2018127196 A1 | 7/2018 |

OTHER PUBLICATIONS

Karlooti et al., Semi-parallel reconfigurable architectures for real-time LDPC decoding, 2004, IEEE, pp. 1 to 7. (Year: 2004).*

Sun et al., A low-power 1 GBPS reconfigurable LDPC decoder design for multiple 4G Wireless standards, 2008, IEEE, pp. 367 to 370 (Year: 2008).*

Liu et al., Design of a multimode QC-LDPC Decoder based on shift routing network, Sep. 2009, IEEE, Trans. on Circuits and Systems, vol. 56, No. 9, pp. 734-738 (Year: 2009).*

Oh et al., Area efficient controller design of barrel shifters for reconfigurable LDPC decoders, IEEE, pp. 240 to 243. (Year: 2008).*

Mediatek Inc., "On Design and Performance of NR eMBB LDPC Code" R1-1707850, May 15, 2017; 15 pages.

International Search Report and Written Opinion issued for PCT Application No. PCT/CN2019/074599, dated Jul. 5, 2019, 9 pages.

Das, S. et al. "A Timing-Driven Approach to Synthesize Fast Barrel Shifters," IEEE Transactions on Circuits and Systems—II: Express Briefs, vol. 55, No. 1, Jan. 2008, 5 pages.

Chen, X. et al. "QSN—A Simple Circular-Shift Network for Reconfigurable Quasi-Cyclic LDPC Decoders," IEEE Transactions on Circuits and Systems—II: Express Briefs, vol. 57, No. 10, Oct. 2010, 5 pages.

Hong, J.-H. et al. "Parallel LDPC Decoding on a Heterogeneous Platform Using OpenCL," KSII Transactions on Internet and Information Systems, vol. 10, No. 6, Jun. 2016, 21 pages.

International Search Report and Written Opinion issued for PCT Application No. PCT/CN2019/074532, dated Oct. 30, 2019, 10 pages.

* cited by examiner

PARALLEL LDPC DECODER

CROSS-REFERENCE TO RELATED APPLICATIONS

The present application is related to commonly assigned U.S. patent application Ser. No. 16/264,070, entitled "RECONFIGURABLE SEGMENTED SCALABLE SHIFTER," filed concurrently herewith on Jan. 31, 2019, the disclosure of which is hereby incorporated by reference herein in its entirety as if fully set forth below for all applicable purposes.

TECHNICAL FIELD

The present invention relates generally to data communication and, more specifically, to decoding correction encoded data.

BACKGROUND OF THE INVENTION

Data communications are widely relied upon in today's society for a variety of purposes, such as messaging between individuals, broadcast communications, controlling machinery, networking of processor-based systems, etc. The data may be communicated through various channels, including wireline, wireless, and optical channels, and may be subject to various sources of noise, interference, and/or other signal degradation. In cellular radio systems, for example, wireless transmission is used to convey bits of information between handsets and base stations. However, the received bits often duller from the transmitted bits, owing to communication errors caused by noise, interference or poor signal strength.

Accordingly, a number of forms of data encoding have been developed in an attempt to render the data (e.g., data transmissions of high data rate applications) more resilient to the effects of transmission through various channels (e.g., unreliable or noisy channels). For example, error correction codes (ECCs), such as turbo codes, low-density parity-check (LDPC) codes, etc., have been implemented to encode data for data communication.

A low-density parity-check (LDPC) code is a linear error correcting code. LDPC uses a layered decoding technique, wherein a single block row of parity equations is evaluated each of a plurality of iterations (the bit values are still updated every iteration). A valid codeword is indicated by all parity equations being satisfied. LDPC codes are finding increasing use in applications requiring reliable and highly efficient information transfer over bandwidth-constrained or return-channel-constrained links in the presence of corrupting noise. In order to solve problems with respect to signal degradation the 5G cellular standard specifies use of LDPC code as the main channel code for cellular communications. In particular, the 5G standard uses quasi-cyclic LDPC (QC-LDPC) coding for data correction code.

Base stations in a 5G network support the communications of multiple users simultaneously. Accordingly, a 5G base station receiver operates to decode multiple code blocks (e.g., the QC-LDPC encoded data of multiple user transmissions) with different sizes from various connected terminals. The iterative decoding techniques typically implemented with respect to QC-LDPC encoded data are relatively logic intensive, often resulting in the decoder logic consuming almost half the receiver computational power. Moreover, traditional QC-LDPC decoders can only decode one code block of any size at a time (see e.g., U.S. Pat. Nos. 8,739,001 and 9,112,530, the disclosures of which are incorporated herein by reference). Thus, the decoding is typically performed separately (e.g., performed by multiple instances of the decoder logic and/or processed serially by repeated operation of an instance of decoder logic) for the multiple code blocks for the connected terminals. When there are a number of users which have small input code block size fed to the WPC decoder, the time required for the decoding process would increase. Existing LDPC decoder configurations are inefficient and do not provide a flexible design.

BRIEF SUMMARY OF THE INVENTION

The present invention is directed to systems and methods providing low-density parity-check (LDPC) decoder configurations capable of decoding multiple code blocks in parallel. For example, a plurality of code blocks may be processed for QC-LDPC decoding in parallel by a parallel LDPC decoder of embodiments of the invention. In accordance with embodiments of the invention, the code blocks for which parallel decoding is provided may be of mixed or of various sizes. Accordingly, parallel LDPC decoders of embodiments of the invention can be reconfigured to simultaneously decode multiple codewords with reconfigurable size.

In operation of embodiments of a parallel LDPC decoder, a plurality of active portions of the decoder logic are configured for parallel processing of a plurality of code blocks, wherein each active region processes a respective code block. The decoder logic active portions of embodiments are provided using a reconfigurable segmented scalable cyclic shifter. A reconfigurable segmented scalable shifter of a parallel LDPC decoder implementation of embodiments supports multiple instruction, multiple data (MIMD), wherein multiple individual different data shifts are implemented with respect to a plurality of code blocks in an instance of data shifting operation. In operation according to embodiments, multiple data shift commands may be utilized such that the plurality of code blocks have an individual shifting command to thereby implement different data shifting with respect to each code block.

Parallel LDPC decoders provided in accordance with concepts of the present invention provide an efficient and flexible design for parallel processing. Utilization of embodiments of a parallel LDPC decoder facilitate computation power reduction with respect to a receiver operating to decode multiple code blocks (e.g., QC-LDPC encoded data of multiple user transmissions). Parallel LDPC decoders of embodiments may additionally or alternatively provide enhanced operational aspects (e.g., 5G base stations may be enabled to support a large number of users in standby mode through use of parallel LDPC decoders of embodiments). Parallel LDPC decoders of embodiments, providing both efficiencies with respect to processing and power consumption, are well suited for use with respect to high performance, broadband data networks, such as those of the evolving 5G cellular standard. For example, 5G cellular networks are expected to offer exponentially greater user experience and more diverse applications, such as new applications in Internet of Things (IoT), vehicular communications and cloud computing, providing significant widening of use cases beyond broadband data and telephony services. Utilization of parallel WPC decoders in accordance with embodiments of the present invention facilitate flexibility and efficiency in 5G cellular network receiver implementations.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with, the accompanying drawings, in which.

DETAILED DESCRIPTION OF THE INVENTION

Figure 1:
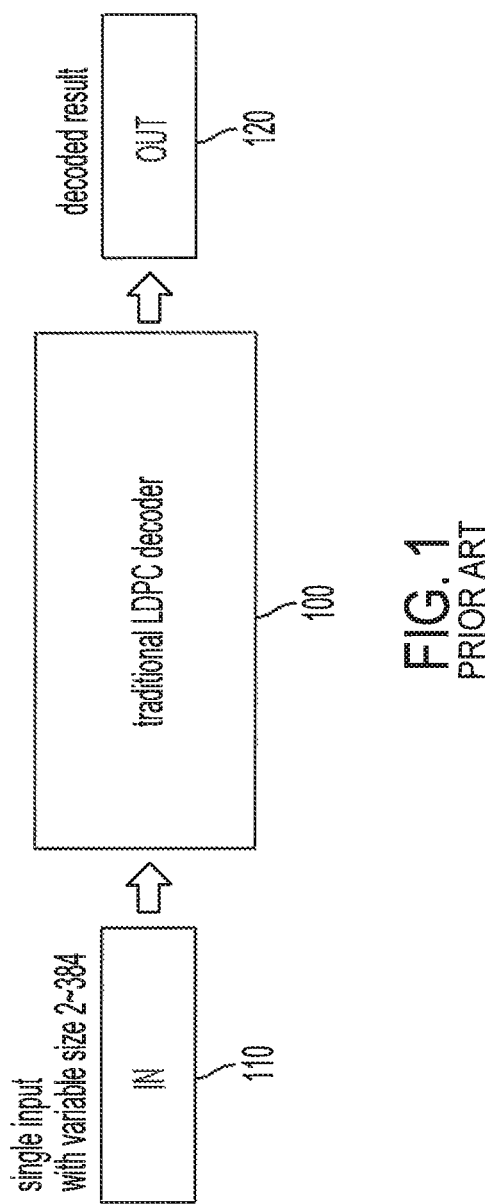
FIG. 1 shows a traditional LDPC decoder configuration.

FIG. 1 shows a traditional LDPC decoder as is commonly used by receivers in 5G cellular networks to decode data encoded using QC-LDPC code for data correction. Accordingly, traditional LDPC decoder 100 of FIG. 1 comprises a 5G LDPC error correction code decoder operable to receive encoded bits provided by received noisy signal 110 (e.g., in log-likelihood ratio (LLR)), and output decoded bits as decoded result 120. In operation, traditional LDPC decoder 100 implements layered decoding logic for iteratively processing parity equations with respect to a single code block of the encoded bits, wherein a valid codeword is indicated by all parity equations being satisfied. It can be appreciated from the foregoing that traditional LDPC decoder 100 can only decode one code block at a time.

In operation, the LDPC decoder input is a code block having a size dependent upon various factors. In 5G cellular networks according to current standards, base graph (BG) matrixes BG1 and BG2 are the two sizes of BG matrixes, wherein BG1=46×68 and BG2=42×52. BG1 has eight different matrixes for different values of lifting parameter Z and BG2 has another eight different matrixes for different values of lifting parameter Z, as shown in the table below. As can be seen from the table below, the lifting parameter $Z=\{2, \ldots, 384\}$ in this 5G cellular network example. The bit-width (K) of LLR is often 6 or 8 bits, although other bit-widths may be used. The code block size in 5G cellular network implementations is proportional to the value of lifting parameter Z. Using the 5G BG1 and K=8 bits configuration as an example, the code block size of the LDPC decoder input=K*68*Z, wherein the code block may generally range from 816 bits (e.g., where LLR bit-width K=6 and lifting parameter Z=2) to 208,896 bits (e.g., where LLR bit-width K=8 and lifting parameter Z=384). The LDPC decoder output comprises decoded bits (hard bit) derived from a code block input, wherein this output is also proportional to the value of lifting parameter Z. Continuing with the 5G BG1 example, output of the LDPC decoder (hard bit)=68*Z (e.g., 136 bits where lifting parameter Z=2 to 26,112 bits where lifting parameter Z=384). Accordingly, implementations of traditional LDPC decoder 100 configured for use with respect to 5G BG1 must be configured to accommodate lifting parameter Z=384, although LDPC decoding of code blocks using smaller lifting parameters (i.e., lifting parameter Z<384) are processed with the remaining capacity of the LDPC decoder remaining idle (e.g., the idle portion of a traditional LDPC decoder is almost inversely proportional to the value of the lifting parameter Z used).

| Set index ($i_{LS}$) (Index of BG Matrix) | Set of lifting parameter sizes (Z) (Value of Z Corresponding to BG Matrix Index) |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

In operation of LDPC decoder 100 only one code block of any size can be decoded at a time. Additional code blocks, such as may be associated with other connected terminals, are separately decoded (e.g., by multiple instances of traditional LDPC decoder 100 and/or by repeated operation of traditional LDPC decoder 100) by this traditional configuration.

Figure 2:
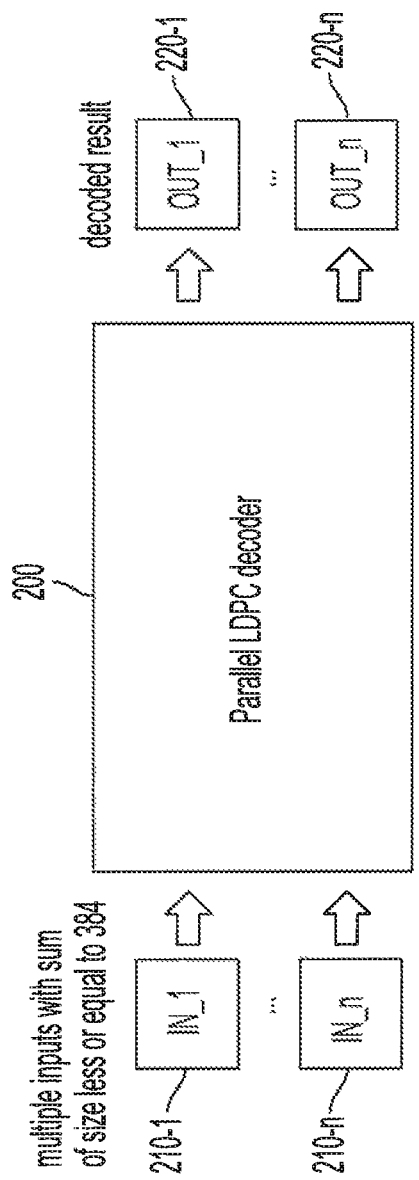
FIG. 2 shows a parallel LDPC decoder configuration according to embodiments of the present invention.

FIG. 2 shows an embodiment of a parallel LDPC decoder in accordance with concepts of the present invention. Parallel LDPC decoder 200 of FIG. 2 comprises a LDPC decoder configuration, such as may be utilized for 5G LDPC error correction code decoding operation, configured to receive encoded bits provided by a plurality of received signals 210-1 through 210-$n$ (e.g., bits in the LLR domain transmitted by a plurality of connected terminals, by a particular connected user, etc.), and output decoded bits (e.g., hard bits) as decoded results 220-1 through 220-$n$ (e.g., corresponding to the decoded code blocks for a plurality of connected terminals, multiple code blocks for a particular user, etc.). Parallel LDPC decoder 200 may, for example be disposed in a base station or other access point serving one or more connected terminals. Of course, there is no limitation to use of parallel LDPC decoders of the present invention in any particular host, such as the aforementioned base station. Parallel LDPC decoders in accordance with the concepts herein may be disposed in user equipment, internet appliances, and other devices implementing data decoding functionality.

It can be appreciated from the foregoing that parallel LDPC decoder 200 of the illustrated embodiment is capable of decoding multiple code blocks in parallel (e.g., a plurality of code blocks may be processed for QC-LDPC decoding in parallel by parallel LDPC decoder 200 of embodiments). The multiple code blocks decoded in parallel by parallel LDPC decoder 200 have a total combined or aggregated lifting parameter size that is less than or equal to the maximum lifting parameter size utilized with respect to the encoded data. For example, in a 5G BG1 configuration where Z=384, the M code blocks decoded by parallel LDPC decoder 200 of embodiments have a total combined lifting parameter size (e.g., $Z_{IN\_1}+Z_{IN\_2}+ \ldots Z_{IN\_M}$) that is less than or equal to Z (i.e., 384 in this example). The various code blocks of the M code blocks may be of mixed or of various data width sizes. For example, each code block for which parallel decoding is provided may comprise a same size code block. Alternatively, each code block for which parallel decoding is provided may comprise different size code blocks. As another example, some code blocks for which parallel decoding is provided may comprise different size code blocks while other code blocks processed in parallel with the aforementioned code blocks may be different size code blocks. In accordance with some embodiments of the invention, the overall input of the parallel LDPC decoder may be formed by combining code blocks that are using the same BO matrix index (e.g., the table above), wherein such code blocks may be of the same or different sizes. For example, to use the same BG matrix, embodiments can combine the code blocks with value of Z from the same BG matrix index set (e.g., combine code blocks with Z={15, 30, 60, 120 and 240}, where all those code blocks use the BG matrix index 7).

As will be better understood from the description below, parallel LDPC decoder 200 of embodiments implements a configuration having a plurality of active portions configured for parallel processing of a plurality of code blocks, wherein each active region processes a respective code block. The decoder logic active portions of embodiments of parallel LDPC decoder 200 are provided using a reconfigurable segmented scalable cyclic shifter, such as shown in detail in the above referenced patent application entitled "RECONFIGURABLE SEGMENTED SCALABLE SHIFTER," wherein the reconfigurable segmented scalable shifter supports multiple instruction, multiple data (MIMD). In operation according to embodiments of parallel LDPC decoder 200, multiple data shift commands may be utilized such that the plurality of code blocks have an individual shifting command to thereby implement different data shifting with respect to each code block. Accordingly, parallel LDPC decoder 200 is capable of decoding code blocks of multiple encoded data streams (e.g., received signals from a plurality of connected terminals) in parallel for efficient and flexible processing.

To aid in understanding concepts of the present invention, it is helpful to understand LDPC decoding operation. LDPC is a linear block code that uses a layered decoding technique, wherein a single block row of parity equations is evaluated in each of a plurality of iterations (the bit values are still updated every iteration) and a valid codeword is indicated by all parity equations being satisfied. Being a linear block code, LDPC codes may be descried via matrices. LDPC codes may also be described using graphical representations.

Figure 3A:
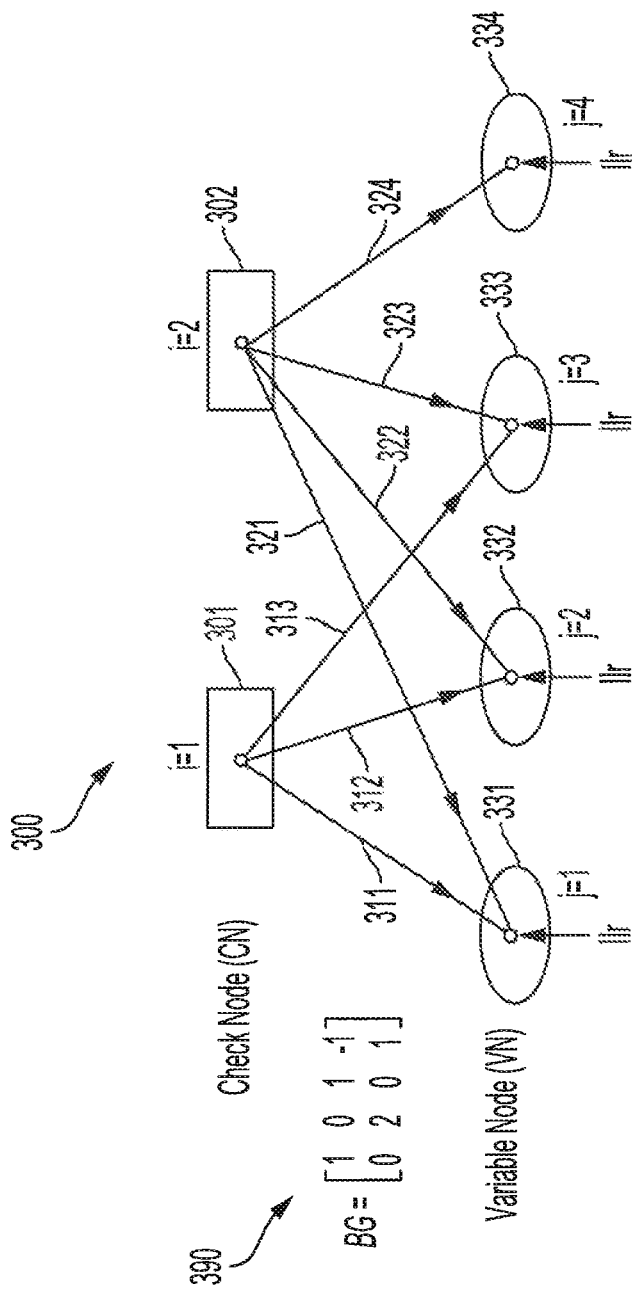
FIG. 3A shows a BG matrix and a Tanner graph construction for an example of a LDPC code.

LDPC codes used according to current 5G cellular standards comprise quasi-cyclic LDPC (QC-LDPC) codes. QC-LDPC codes are characterized by two parameters, namely lifting factor (Z) and base graph (BG) matrix. FIG. 3A shows both a base graph matrix (BG) and a Tanner graph construction for an example of a QC-LDPC code using 2 check nodes and 4 variable nodes. It should be appreciated that the LDPC code of the illustrated example includes only 2 check nodes and 4 variable nodes to simplify the description. The LDPC codes for which parallel LDPC decoding may be provided by embodiments of the invention are likely to be much larger than this example. For example, in the 5G cellular communication standard the size of BG1 is currently 46×68 (e.g., 46 check nodes and 68 variable nodes) and the size of BG2 is currently 42×52 (e.g., 42 check nodes and 52 variable nodes).

Tanner graph 300 of FIG. 3A includes two different sets of nodes (check nodes (CNs) 301 and 302 and variable nodes (VNs) 331-334, wherein the edges (e.g., edges 311-313 and 321-324) only connect nodes of the different node sets. It can be seen that Tanner graph 300 represents the same LDPC code as the matrix of BG 390, wherein the BG matrix rows correspond to the Tanner graph CNs and the BG matrix columns correspond to the Tanner graph VNs. In particular, CNs is connected to $VN_j$ if the element $BG_{ij}$ is non-negative. The value of elements of BG represent the cyclic shift value utilized in the iterative decoding process.

In operation according to a LDPC decoding process (e.g., QC-LDPC decoding), decoding is done by iteratively passing the message from VN to CN (V2C), then from CN to VN (C2V), one CN by one CN. This LDPC decoding operation is illustrated in the Tanner graph instances of FIG. 3B, wherein one instance of a LDPC decoding operation is shown. In the illustrated LDPC decoding iteration instance, in providing an iteration of message passing for a first one of the CNs, Tanner graph 300-1 shows V2C operation passing the message from VNs 331-333 to CN 301 and Tanner graph 300-2 shows a C2V operation passing the massage from CN 301 to VNs 331-333. It should be appreciated that either a C2V operation to initially pass the message from CN 301 to VNs 311-333 or a prior iteration of LDPC decoding has been performed with respect to the LDPC decoding operation shown in Tanner graph 300-1. In providing an iteration of message passing for the next one of the CNs, Tanner graph 300-3 shows V2C operation passing the message from VNs 331-334 to CN 302 and Tanner graph 300-4 shows a C2V operation passing the massage from CN 302 to VNs 331-334.

Logic of the LDPC decoder implements algorithms to decode the LDPC codes in the aforementioned C2V and V2C operations. A LDPC decoder algorithm utilized by a LDPC decoder may, for example, comprise the min-sum algorithm, the sum-product algorithm, the belief propagation algorithm, or the message passing algorithm. To aid in understanding concepts of the present invention, examples utilizing the min-sum algorithm will be discussed. It should be appreciated, however, that the concepts herein are not limited to application with respect to the LDPC decoder algorithm of this example.

Figure 3B:
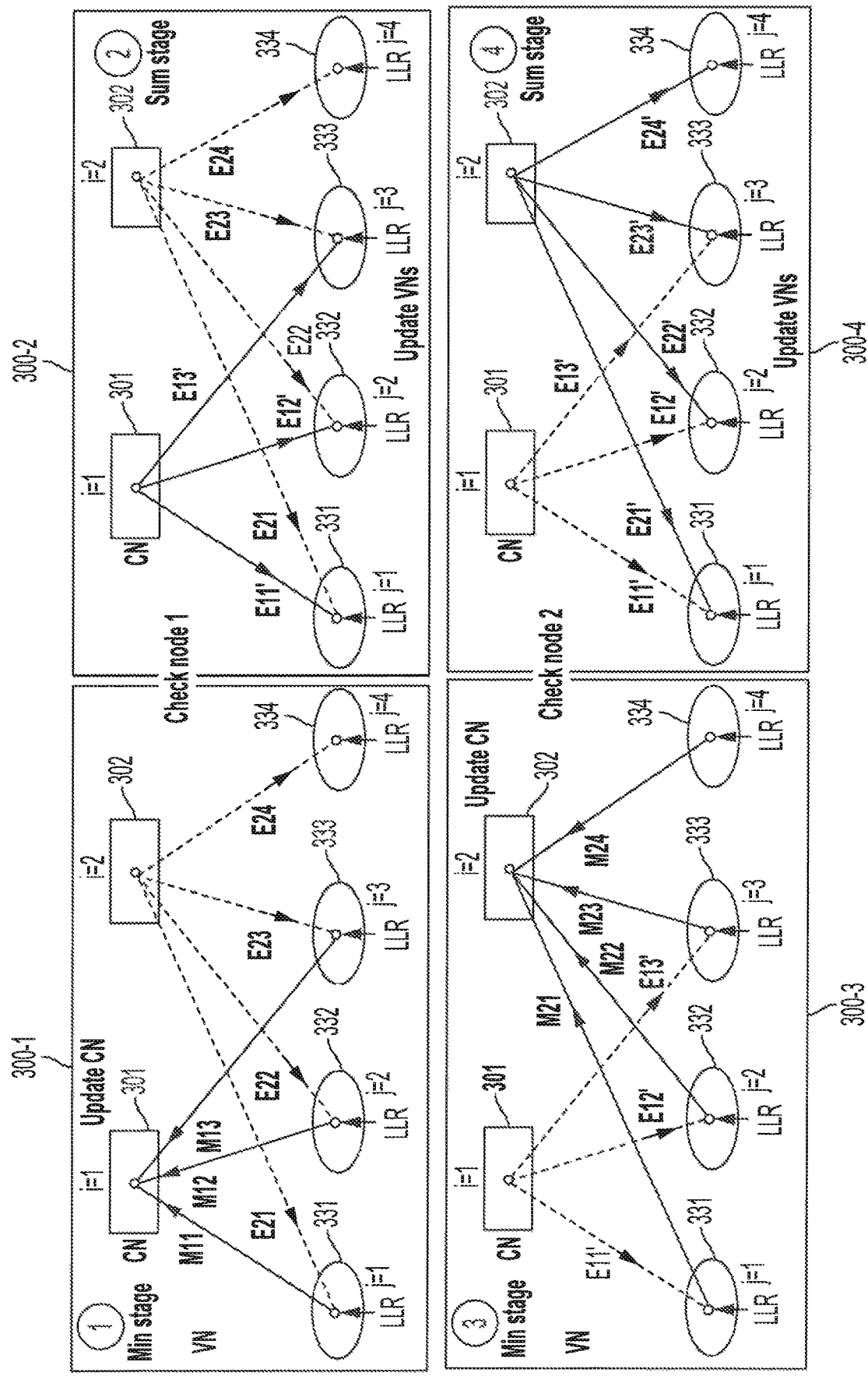
FIG. 3B shows operation according to an iterative LDPC decoding process.
Figure 3C:
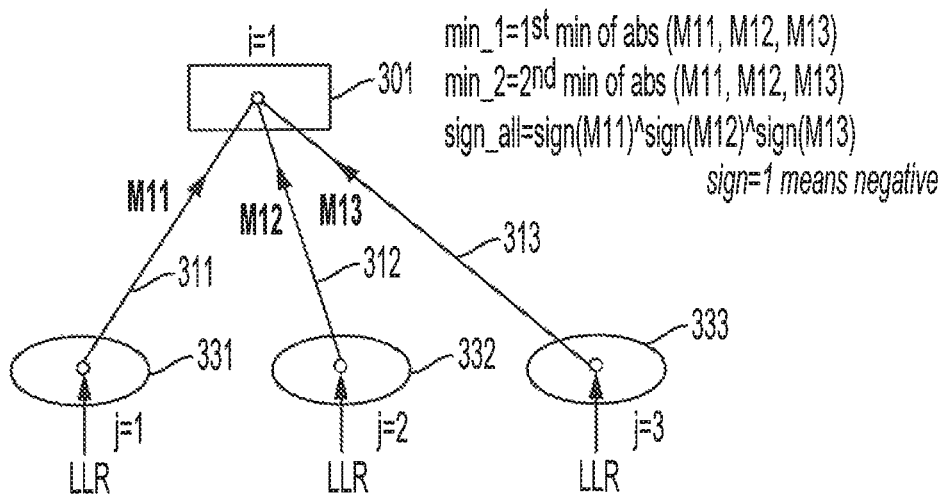
FIGS. 3C and 3D show min stage operation with respect to a LDPC decoder utilizing the min-sum algorithm, showing V2C operation of a LDPC decoder.
Figure 3D:
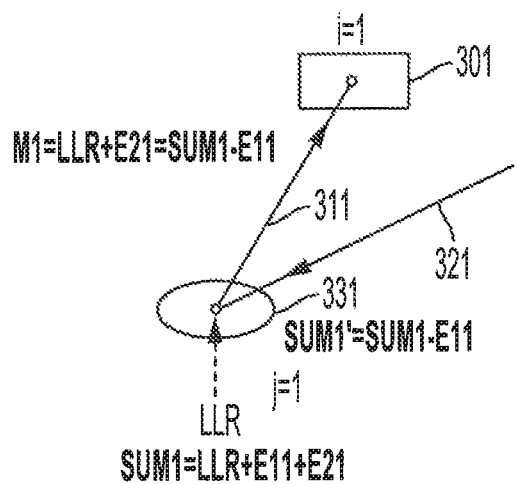

In operation of a LDPC decoder utilizing the min-sum algorithm, a min stage is utilized in the V2C operation when passing the message from the VNs to the CNs, as shown in FIG. 3C. As shown in the illustrated embodiment, logic of the LDPC decoder (e.g., using comparator logic) may determine a first minimum with respect to the messages passed from the VNs connected to a CN (e.g., $min\_1=1^{st}$ min of abs (M11, M12, M13)) and a second minimum with respect to the messages passed from the VNs connected to the CN (e.g., $min\_2=2^{nd}$ min of abs (M11, M12, M13)). Logic of the LDPC decoder (e.g., using XOR gate logic) may further determine a sign for the messages passed from the VNs connected to the CN (e.g., sign_all=sign(M11)^sign (M12)^sign(M13), wherein sign=1 means negative). The messages passed from the connected VNs may be computed by logic of the LDPC decoder (e.g., using arithmetic logic) from the data previously provided in the messages passed from the CN in a prior iteration of the decoding. As shown in FIG. 3D, the message passed from VN 331 to CN 301 may, for example, be computed as M11=LLR+E21=SUM1−E11, wherein SUM1=LLR+E11+E21 and SUM1'=SUM1−E11 (initially all Eij=0 and all SUMj=LLR_j). The messages passed from each of the other connected VNs may be similarly computed.

Figure 3E:
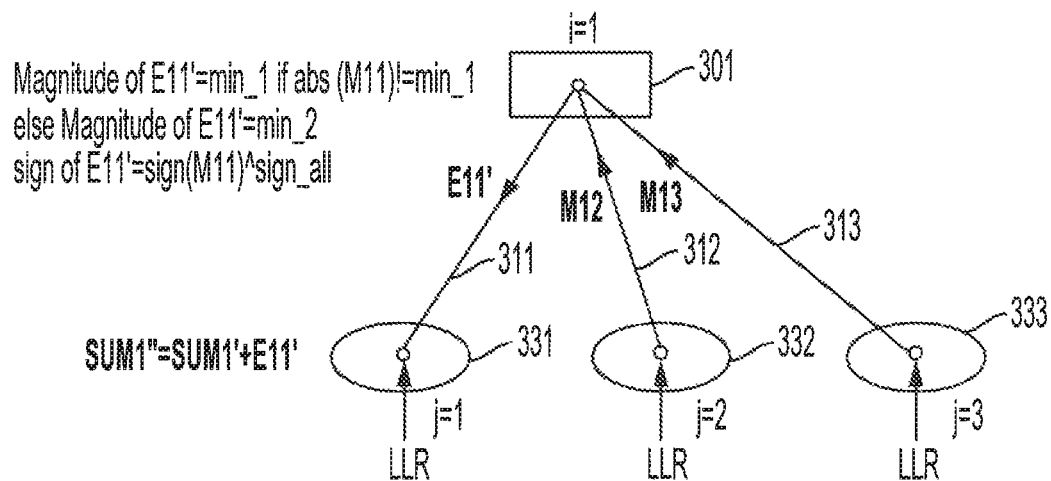
FIGS. 3E and 3F show sum stage operation with respect to a LDPC decoder utilizing the min-sum algorithm, showing C2V operation of a LDPC decoder.
Figure 3F:
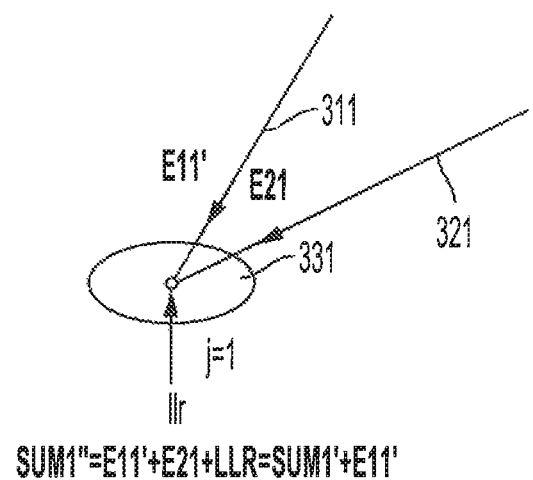

Correspondingly, a sum stage is utilized in the C2V operation of the LDPC decoder of this example when passing the message from the CNs to the VNs, as shown in FIG. 3E. As shown in the illustrated embodiment, logic of the LDPC decoder (e.g., using comparator logic) may determine a magnitude with respect to the messages passed from a CN to the connected VNs (e.g., Magnitude of E11'=min_1 if abs(M11) 1=min_1, else Magnitude of E11'=min_2). Logic of the LDPC decoder (e.g., using XOR gate logic) may further determine a sign for the messages passed from the CN to the connected VNs (e.g., sign of E11'=sign (M11)^sign_all, wherein sign=1 means negative). The messages passed from the CN may be used by logic of the LDPC decoder (e.g., using arithmetic logic) in computing a message to be provided to the CN in a V2C operation in a subsequent iteration of the decoding. As shown in FIG. 3F, the message passed from CN 301 may, for example, be used to compute SUM1" (e.g., SUM1"=E11'+E21+LLR=SUM1'+E11') for a subsequent message passed from VN 331 to CN 301. Similar computations may be made for each of the other connected VNs.

Multiple iterations (e.g., repeated processing in accordance with the Tanner graphs of FIG. 3B, wherein the prime designators shown for the messages are incremented in each iteration) of the forgoing min-sum algorithm may be performed by the LDPC decoder and the parity equations evaluated in each iteration evaluated. This iterative processing may be ended, and a valid codeword of the code block being decoded is indicated, when all the parity equations are satisfied.

Figure 4A:
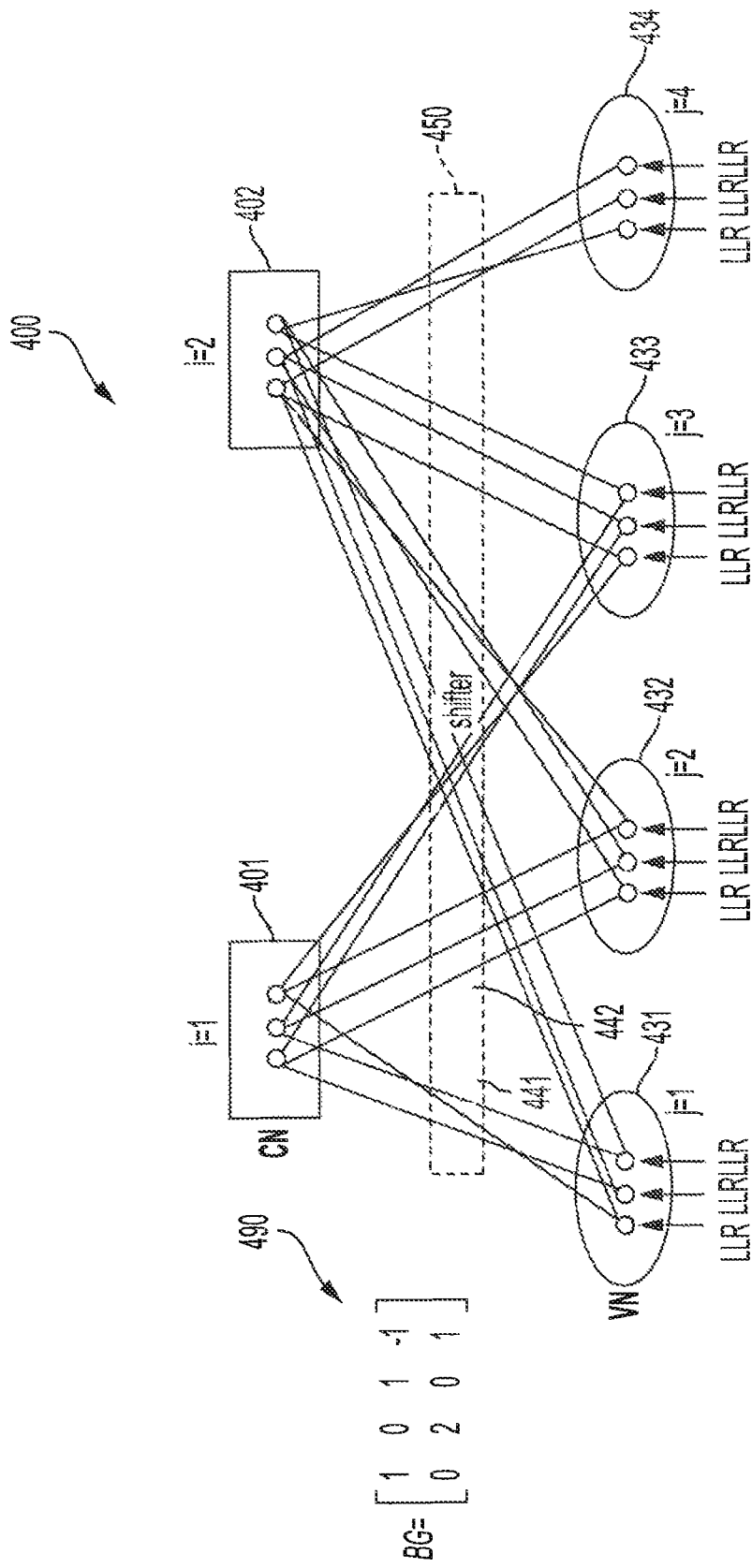
FIGS. 4A and 4B show BG matrix and a Tanner graph constructions for examples of LDPC codes.
Figure 4B:
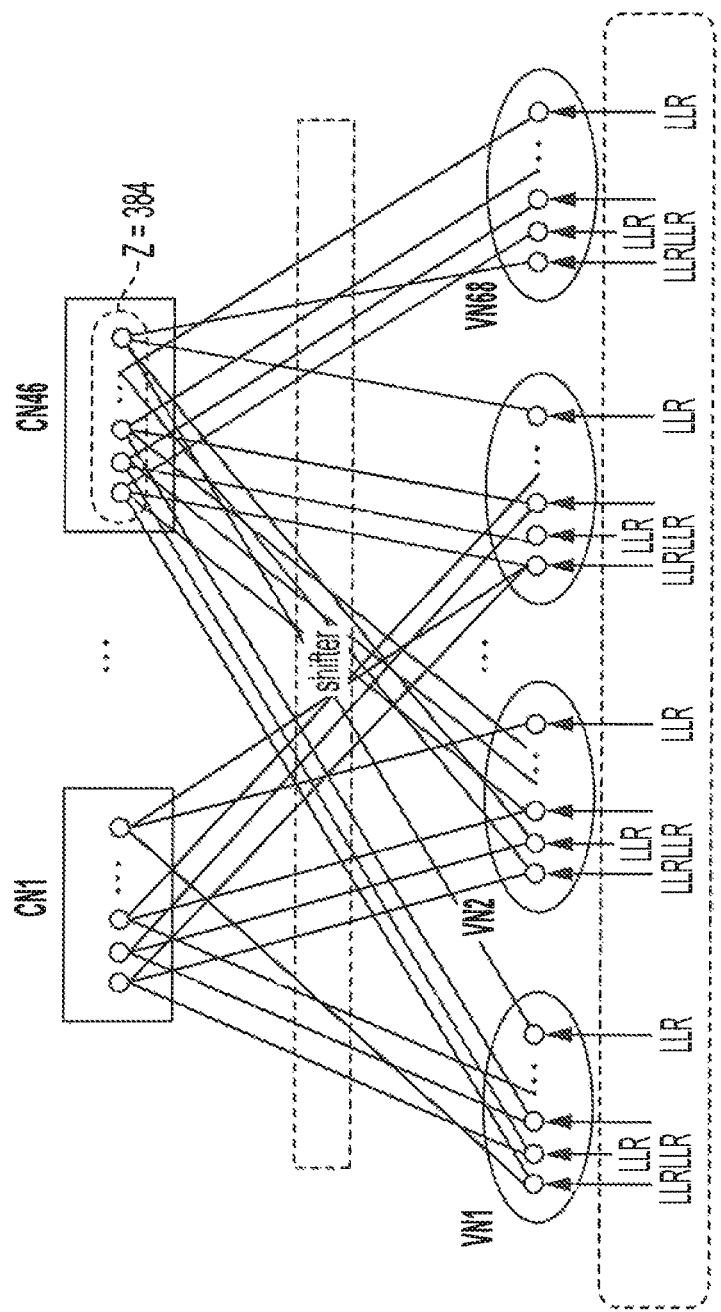

The above example shows a simplified LDPC decoding process where the lifting parameter Z=1. Higher order lifting parameters (also referred lifting value, lifting size, or expansion factor) may be utilized with respect to LDPC codes to improve the decoding reliability. FIG. 4A shows both BG matrix and a Tanner graph construction for an example of a LDPC code using 2 cheek nodes and 4 variable nodes with the lifting parameter Z=3 (each entry of the BG matrix is expanded by [Z×Z] identity matrix). It should be appreciated that the lifting parameter of the illustrated embodiment of the LDPC code provides a relatively simple example of the use of such lifting parameters, and is not a limitation with respect to application of the concepts of the present invention in an implementation for a 5G network, for example, lifting parameter Z={2, . . . , 384}. FIG. 4B, for example, shows a Tanner graph construction for an example of a LDPC code using 46 check nodes and 68 variable nodes with the lifting parameter Z=384 (e.g., corresponding to an implementation for a 5G BG1 configuration, wherein BG1=46×68 and lifting parameter Z=384, it being understood that the particular exemplary cyclic shift value of the illustrated connections between the CNs and VNs are not specified by the 5G standard).

Like Tanner graph 300 discussed above, Tanner graph 400 of FIG. 4A includes two different sets of nodes (check nodes (CNs) 401 and 402 and variable nodes (VNs) 431-434), wherein the edges only connect nodes of the different node sets. However, it can be seen that where edges connect the CNs to respective ones of the VNs of Tanner graph 400 there are 3 edges, corresponding lifting parameter Z=3 (e.g., each input of VNs 431-434 includes Z=3 number of LLR). Accordingly, there are Z number of messages passed between the CNs and connected ones of the VNs in LDPC decoding operation according to Tanner graph 400, wherein a predefined cyclic shift is provided when message passing between CN and VN. The value of elements of BG represent the cyclic shift value utilized in the LDPC decoding process (negative values of BG indicate no connection and thus no cyclic shift). Shifter 450 of the illustrated embodiment provides cyclic shifts having values in accordance with the non-negative values of BG (e.g., cyclic shift of 1 when passing data between CN 401 and VN 431, cyclic shift of 0 when passing data between CN 401 and VN 432, cyclic shift of 1 when passing data between CN 401 and VN 433, cyclic shift of 0 when passing data between CN 402 and VN 431, cyclic shift of 2 when passing data between CN 402 and VN 432, cyclic shift of 0 when passing data between CN 402 and VN 433, and cyclic shift of 1 when passing data between CN 402 and VN 434).

As discussed with respect to Tanner graph 300, LDPC decoding in accordance with Tanner graph 400 iteratively passes the message from VN to CN (V2C), then from CN to VN (C2V), one CN by one CN. However, as the messages are passed between the CNs and VNs, cyclic shifting is provided in accordance with the values of corresponding elements of BG. Algorithms, such as the aforementioned min-sum algorithm, sum-product algorithm, belief propagation algorithm, and message passing algorithm, may be utilized by logic of the LDPC decoder with respect to the appropriately shifted messages to decode the codes.

Figure 5A:
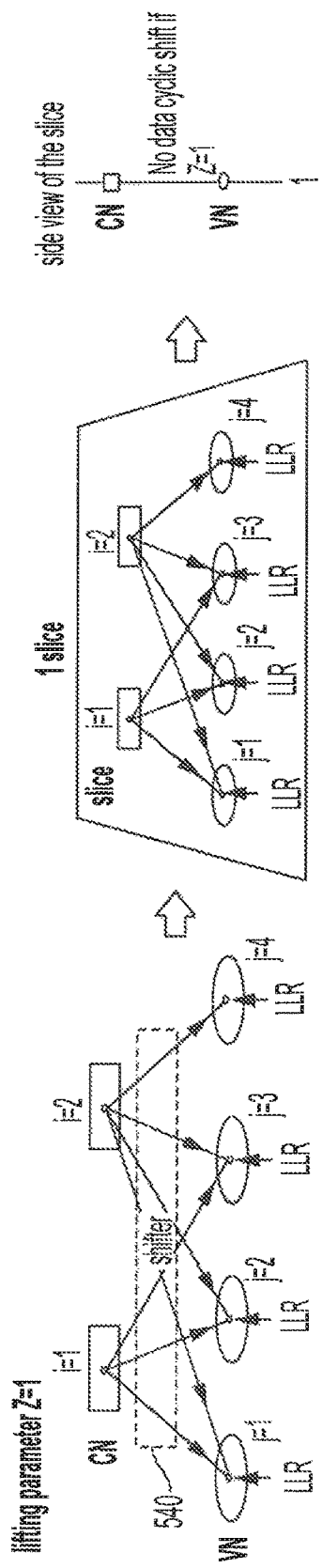
FIGS. 5A-5C show slice views for respective Tanner graph constructions of example LDPC codes.
Figure 5B:
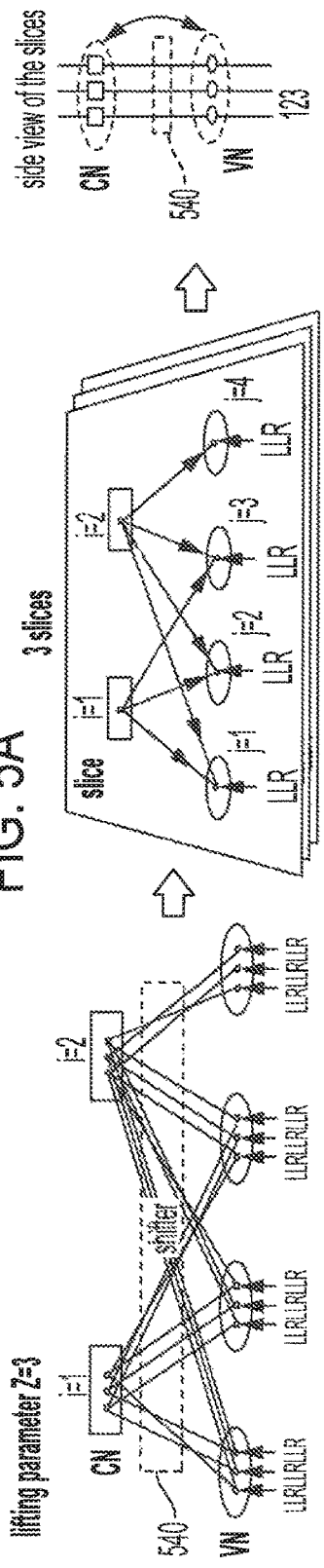
Figure 5C:
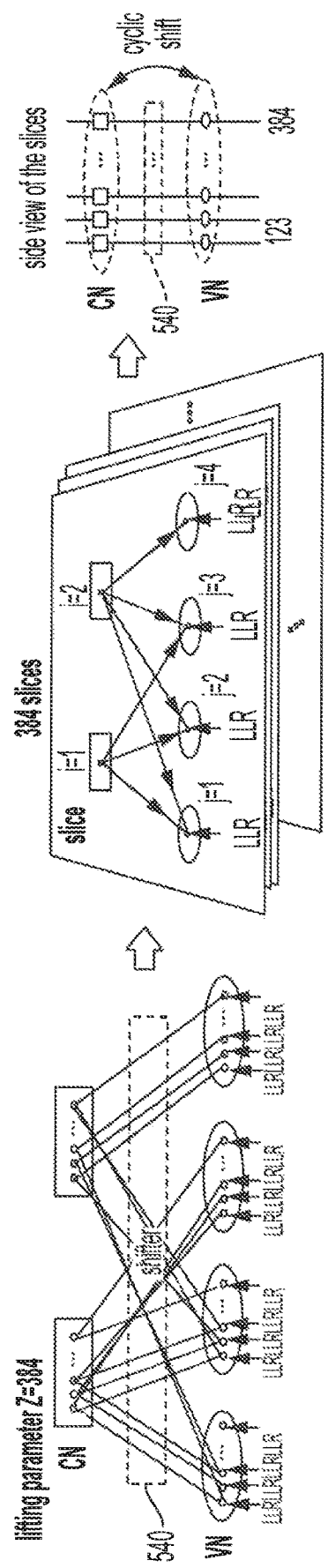

FIGS. 5A-5C show slice views for respective Tanner graph constructions of example LDPC codes to aid in understating operation of LDPC decoders, wherein FIG. 5A shows an example for lifting parameter Z−1, FIG. 5B shows an example for lifting parameter Z=3, and FIG. 3C shows an example for lifting parameter Z=384. As shown in the example of FIG. 5A, a Tanner graph construction for an example of a LDPC code corresponding to that of Tanner graph 300 of FIG. 3A may be implemented in 1 slice (i.e., the number of slices corresponding to lifting parameter Z=1), wherein no data cyclic shift is provided when messages pass between CNs and VNs. However, as shown in FIG. 5B, a Tanner graph construction for an example of LDPC code corresponding to that of Tanner graph 400 of FIG. 4A may be implemented in 3 slices (i.e., the number of slices corresponding to lifting parameter Z=3), wherein data is cyclically shifted among the different slices when messages pass between CNs and VNs using shifter 540 having a data width greater than or equal to the largest lifting parameter Z accommodated (Z=3 in this example)). Similarly, as shown in FIG. 5C a Tanner graph construction for an example of LDPC code with lifting parameter Z=384 may be implemented in 384 slices (i.e., the number of slices corresponding to lifting parameter Z=384), wherein data is cyclically shifted among the different slices when messages pass between CNs and VNs using shifter 540 having a data width greater than or equal to the largest lifting parameter Z accommodated (Z=384 in this example)).

Figure 6:
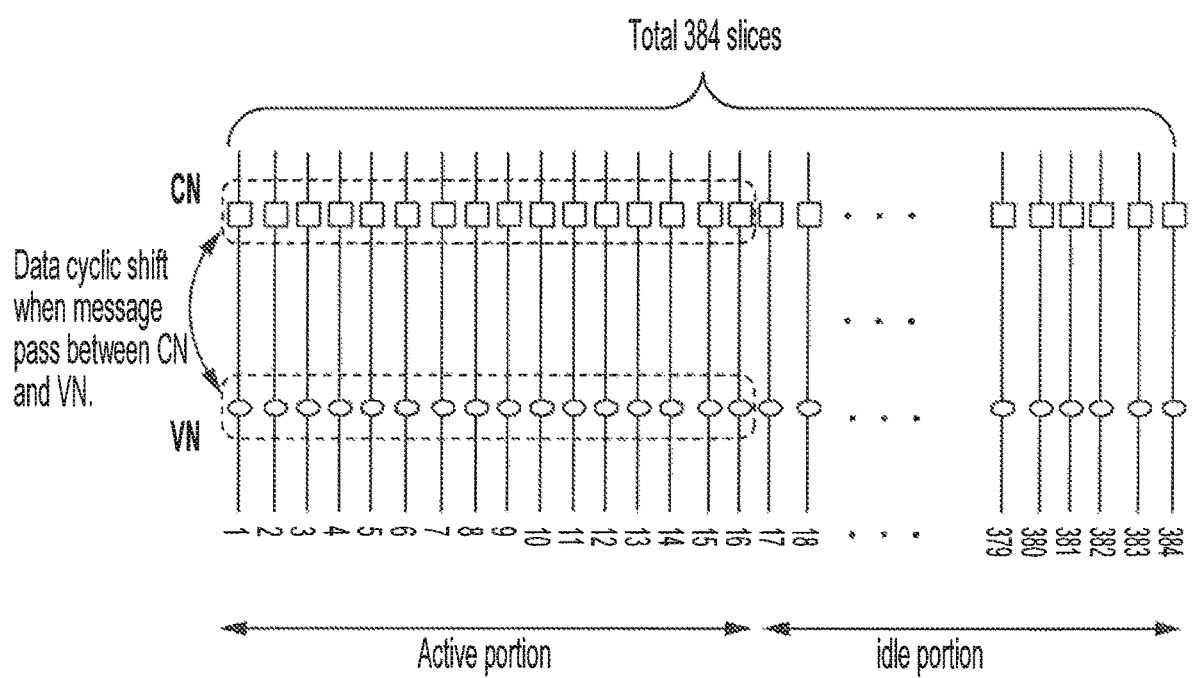
FIG. 6 shows a slice view of a LDPC decoder configuration.

Traditional LDPC decoders can only decode one code block of any size at a time. Referring to the lifting parameter Z=384 example of FIG. 5C for instance, the hardware of the LDPC decoder is configured to accommodate Z=384 (i.e., provides a 384 slice implementation). If, however, the lifting parameter is small (e.g., lifting parameter Z=16) only a small portion of the slices will be activated, with the other slices idle, throughout the iterations of the LDPC decoding operation. This is illustrated in FIG. 6, wherein for the case of lifting parameter Z=16 slices 1-16 comprise the active slice and slices 17-384 remain idle throughout decoding the code block.

Figure 7:
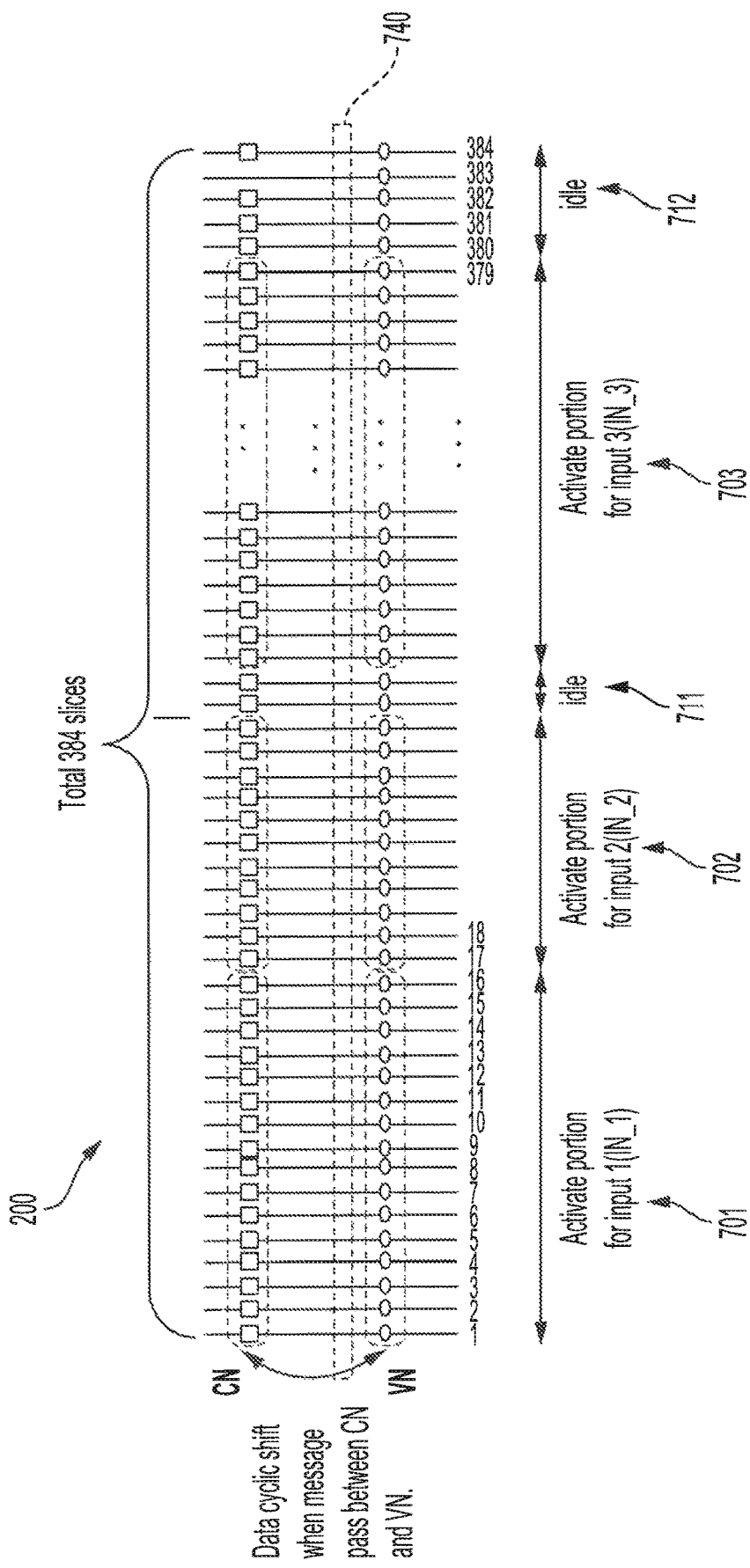
FIG. 7 shows a slice view of a LDPC decoder configuration utilizing a reconfigurable segmented scalable shifter configuration according to embodiments of the present invention.

Parallel LDPC decoder configurations of embodiments of the present invention are capable of decoding multiple code blocks in parallel, as illustrated in FIG. 7. In particular, FIG. 7 shows detail with respect to an implementation of parallel LDPC decoder 200 configured to accommodate parallel processing of a plurality of code blocks having a total combined lifting parameter size (e.g., $Z_{IN\_1} + Z_{IN\_2} + \ldots Z_{IN\_M}$) that is less than or equal to Z (i.e., 384 in this example) using a reconfigurable segmented scalable shifter. The reconfigurable segmented scalable shifter configuration of parallel LDPC decoder 700 uses shifter 740 comprising a reconfigurable segmented scalable shifter implementation to provide active portions 701-703 configured for parallel processing of code blocks from a plurality of input signals, shown as IN_1, IN_2, and IN_3 (e.g., as may correspond to signals from a plurality of connected terminals served by a base station hosting a receiver utilizing the parallel LDPC decoder, signals for a particular user, etc.). In accordance with embodiments of the invention, the reconfigurable segmented scalable shifter has a data width greater than or equal to the largest lifting parameter Z accommodated (Z=384 in this example). The reconfigurable segmented scalable shifter of parallel LDPC decoder 200 shown in FIG. 7 preferably supports MIMD operation, wherein multiple individual different data shifts are implemented with respect to a plurality of code blocks in an instance of data shifting operation, to facilitate various active region configurations. It should be appreciated that the particular active regions and idle regions shown in FIG. 7 are merely exemplary, and that embodiments may be configured differently to accommodate different numbers and of code blocks, code blocks of different sizes, and various combinations of lifting parameter sizes.

In operation, each active region processes a respective code block (e.g., active portion 701 processes a code block of IN_1, active portion 702 processes a code block of IN_2, and active portion 703 processes a code block of IN_3) in parallel. For example, a code block of IN_1 having lifting parameter Z=16 may be provided to slices 1 through 16 of parallel LDPC decoder 200 for providing appropriate data cyclic shifting when messages pass between CNs and VNs. Since lifting parameter Z=16 is less than the total lifting parameter Z=384 accommodated by parallel LDPC decoder 200, other code blocks may be provided decoding operation using portions of parallel LDPC decoder 200 that are unused by decoding operation of the code block of IN_1. In the illustrated embodiment, a code block of IN_2 having lifting parameter Z=(X-17+1) may be provided to slices 17 through X of parallel LDPC decoder 200 for providing appropriate data cyclic shifting when messages pass between CNs and VNs. Similarly, a code block of IN_3 having lifting parameter Z=(379-Y+1) may be provided to slices Y through 379 of parallel LDPC decoder 200 for providing appropriate data cyclic shifting when messages pass between CNs and VNs.

As shown in the example of FIG. 7, some portion or portions of parallel LDPC decoder 200 may remain idle even when configured to decode a plurality of code blocks in parallel. For example, idle portions 711 and 712 may correspond to an amount of the total lifting parameter size remaining in excess of the aggregate lifting parameter size of the plurality of code blocks decoded. In embodiments implementing a sectioned configuration in which the shifter is divided into multiple sections (see e.g., the sectioned shifter stage configurations of the above referenced patent application entitled "RECONFIGURABLE SEGMENTED SCALABLE SHIFTER"), idle portions 711 and 712 may correspond to portions of respective sections remaining in excess of the lifting parameter size of the code word processed. It should be appreciated, however, that the portion of parallel LDPC decoder remaining idle with respect to decoding a plurality of code blocks in parallel (e.g., code blocks of IN_1, IN_2, and IN_3) according to embodiments will typically be considerably less than the idle portion of a traditional LDPC decoder operable to decode a single code block (e.g., the code block of IN_1).

Figure 8:
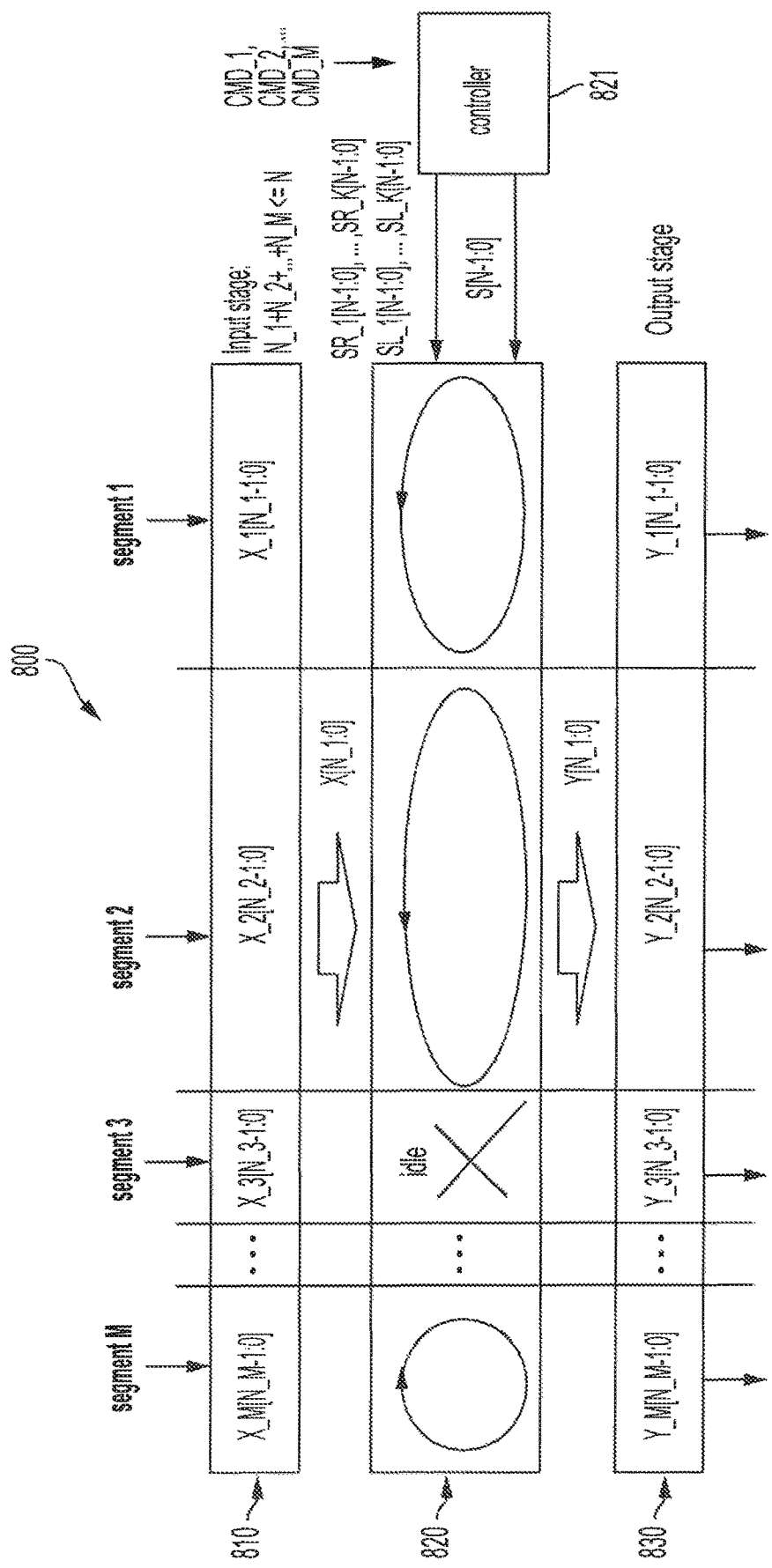
FIG. 8 shows a reconfigurable segmented scalable shifter configuration as may be utilized in a parallel LDPC decoder of embodiments of the present invention.

The slices of FIG. 7 may be implemented using a reconfigurable segmented scalable shifter as shown in the above reference patent application entitled "RECONFIGURABLE SEGMENTED SCALABLE SHIFTER" (e.g., shifters corresponding to shifter 450 shown in FIG. 4A, shifter 540 shown in FIGS. 5A-5C, and shifter 740 shown in FIG. 7 may each comprise reconfigurable segmented scalable shifter implementations). FIG. 8 shows an embodiment of reconfigurable segmented scalable shifter 800 as may be utilized in parallel LDPC decoder 200. Reconfigurable segmented scalable shifter 800, shown as including input stage 810, shifter stage 820, and output stage 830 implementing a segmentation configuration, provides a reconfigurable shifter configuration supporting multiple instruction, multiple data (MIMD). In particular, input data (X) supplied to reconfigurable segmented scalable shifter 800 comprises a number of messages wherein multiple individual different data shifts may be implemented at a time in parallel with respect to these messages to provide output data comprising a plurality of individually shifted messages. Accordingly, multiple data shift commands (e.g., CMD_1, CMD_2, . . . . CMD_M) are shown in association with the messages of the input data. In operation according to embodiments, data shift commands are provided with respect to each input data (e.g., input data comprising multiple messages) to facilitate different data shifting with respect to each output message. The segmentation configuration implemented according to the embodiments of reconfigurable segmented scalable shifter 800 facilitates utilizing idle portion of logic for the shift of additional input data.

Input stage 810 of reconfigurable segmented scalable shifter 800 of embodiments may comprise configurable memory elements (e.g., random access memory (RAM), flash memory, magnetic memory, optical memory, etc.) and/or controllable data paths (e.g., controllable data path elements) suitable for storage of the data of messages input to reconfigurable segmented scalable shifter 800 for which shifting is provided and for controllably associating such data with reconfigurable segments of shifter stage 820. In operation according to embodiments, input stage 810 is utilized to associate the one or more messages of the input data with corresponding segments of shifter stage 820. For example, in the illustrated embodiment, the input data includes messages X_1, X_2, X_3, . . . X_M (e.g., such as may correspond to the data of code blocks being passed between respective CNs and VNs for which data shifting is to be provided), wherein input stage 810 facilitates correspondence of the N_1 number of bits of message X_1 (e.g., bits 0 to N_1-1 of message X_1) to segment 1 of shifter stage 820, correspondence of the N_2 number of bits of message X_2 (e.g., bits 0 to N_2-1 of message X_2) to segment 2 of shifter stage 820, correspondence of the N_3 number of bits of message X_3 (e.g., bits 0 to N_3-1 of message X_3) to segment 3 of shifter stage 820, and correspondence of the N_M number of bits of message X_M (e.g., bits 0 to N_M−1 of message X_M) to segment M of shifter stage 820.

Shifter stage 820 of embodiments may comprise controllable data path elements (e.g., multiplexers and associated control elements) suitable for implementing data shifts. Such data path elements of embodiments may implement various shifter architectures, such as logarithmic shifter configurations, barrel shifter configurations, combinational shifter configurations, etc. Shifter stage 820 provides reconfigurable, scalable segments that are utilized in implementing data shifting in parallel with respect to multiple messages of input data. Controller 821 of shifter stage 820 is shown in the illustrated embodiment for providing individual shifting commands to the segments of shifter stage 820 in accordance with data shift commands (e.g., CMD_1, CMD_2, . . . CMD_M) provided in association with the input data (e.g., X=X_1, X_2, X_3, X_M). Data shifting is independently provided by segments (e.g., left cyclic by segment 1, left cyclic by segment 2, and right cyclic by segment M) of shifter stage 820 in accordance with the respective data shift commands to thereby implement multiple individual different data shifts at a time in parallel.

Reconfigurable segmented scalable shifter 800 of embodiments is configured to be reconfigurable with respect to data width and/or shift command of each input data. For example, shifter stage 820 of embodiments is reconfigurable with respect to the number of segments (M) (e.g., 1≤M≤N), the size of each segment (N_m) (e.g., N≥N_m≥2), the shift value (S) of each segment (S_m) (1≤S_m≤N), the shift direction (Dir) of each segment (Dir_m) (e.g., Dir_m is left or right), and/or the shift type (T) of each segment (T_m) (e.g., T_m is logical, arithmetic, or cyclic), any or all of which may be controlled by controller 821. The individual data shift commands (e.g., CMD_1, CMD_2, . . . CMD_M) provided to reconfigurable segmented scalable shifter 800 (e.g., to controller 821) of embodiments may include various such information (e.g., the size of the respective segment N_m), the shift value of the respective segment (S_m), the shift direction of the respective segment (Dir_m), the shift type of the respective segment (T_m), etc.). Additionally or alternatively, one or more general data shift commands (e.g., CMD, not shown in the illustrated embodiment) including various such information (e.g., the number of segments (M), the size of each segment (N_m), a globally applicable shift value (S), a globally applicable shift direction (Dir), a globally applicable shift type (T), etc.) may be provided to reconfigurable segmented scalable shifter 800 (e.g., to controller 821) of embodiments for controlling aspects generally applicable to the shifter and/or segments thereof.

Output stage 830 of embodiments may comprise configurable memory elements (e.g., RAM, flash memory, magnetic memory, optical memory, etc.) and/or controllable data paths (e.g., controllable data path elements) suitable for controllably associating reconfigurable segments of shifter stage 820 with messages of output data for storage of the shifted data of the messages for which shifting is provided. In operation according to embodiments, output stage 830 is utilized to associate segments of shifter stage 820 with the one or more messages of the output data. For example, in the illustrated embodiment, the output data includes messages Y_1, Y_2, Y_3, . . . Y_M (e.g., such as may correspond to the data of code blocks passed between respective CNs and VNs for which data shifting has been provided), wherein output stage 810 facilitates correspondence of the N_1 number of the shifted bits of message Y_1 (e.g., bits 0 to N_1-1 of message Y_1) to segment 1 of shifter stage 820, correspondence of the N_2 number of shifted bits of message Y_2 (e.g., bits 0 to N_2-1 of message Y_2) to segment 2 of shifter stage 820, correspondence of the N_3 number of un-shifted bits of message Y_3 (e.g., bits 0 to N_3-1 of message Y_3) to segment 3 (idle in this illustrated example) of shifter stage 820, and correspondence of the N_M number of shifted bits of message Y_M (e.g., bits 0 to N_M−1 of message Y_M) to segment M of shifter stage 820.

Segmentation may be implemented for data shifting by reconfigurable segmented scalable shifter 800 by providing individual data shift control with respect to each path of a data shifter stage to implement different data shift commands for the segments and control multiple data shifts in parallel. Embodiments of a parallel LDPC decoder, and a reconfigurable segmented scalable shifter thereof, may be implemented to accommodate relatively large lifting parameters (e.g., Z=384 for a 5G QC-LDPC decoder implementation). Accordingly, the control signal structure may become relatively complicated as configurations of a reconfigurable segmented scalable shifter are scaled up for such implementations. Embodiments may thus implement a less complicated shifter stage configuration which nevertheless is reconfigurable for scalability in supporting data shifting with respect to various hit lengths of data and supports data shifting of differing bit lengths in parallel.

Figure 9:
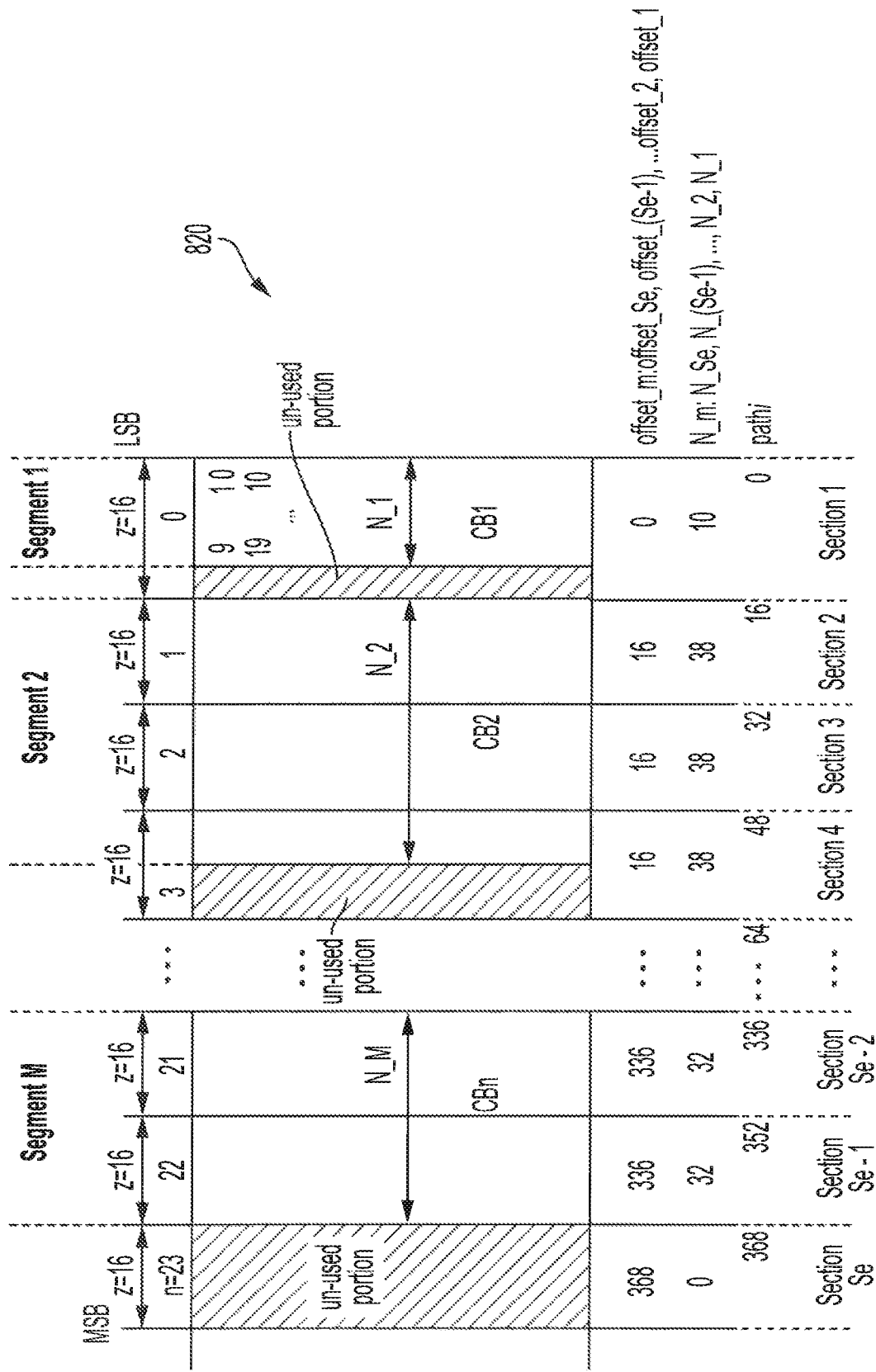
FIG. 9 shows a sectioned shifter stage configuration as may be utilized in a parallel LDPC decoder of embodiments of the present invention.

FIG. 9 illustrates a sectioned shifter stage configuration which is readily scalable to accommodate large data widths of a parallel LDPC decoder in accordance with concepts of the present invention. Shifter stage 820 shown in FIG. 9 implements a sectioned configuration in which each of the left shift and right shift portions (either one of which is represented in the illustration) are divided into multiple sections, wherein the data paths of each section share the same control signals. For example, the shifter may be divided into a plurality of sections of equal data widths, different data widths, or a combination thereof where, although each section may be controlled individually to provide different data shifting (e.g., direction and/or shift value), all data of a section controlled together for same data shifting direction and shift value). Such configurations may, for example, provide a satisfactory tradeoff between the number of segments and hardware cost.

Segmentation for data shifting with respect to differing bit lengths may be implemented by configuring a group of one or more sections for each segment, wherein the group of sections for a particular segment provides an aggregate data width equal to or greater than the data width of the segment. Accordingly, one or more messages of various data widths from input data may be provided data shifting in each segment as hosted by a respective group of one or more sections, wherein the messages may be provided individual data shilling in parallel through appropriately controlling the sections for each segment.

The number of sections (Se) and the section data width (W) are preferably related to the shifter data width (N) so that the total data with is sectioned (e.g., N=Se*W). In the exemplary embodiment of shifter stage 820 shown in FIG. 9, the shifter data width N=384, the number of sections Se=24, and the data width of each section W=16 (e.g., 384=24*16). M number of segments may be hosted by various groups of sections of shifter section 820, wherein the number of segments is less than or equal to the shifter data width (e.g., 1≤M≤N) and the aggregate size of the segments is less than or equal to the shifter data width (e.g., N_1+ N_2+ . . . N_M≤N).

In accordance with embodiments of the invention, a segment is aligned with the LSB of a first section of the corresponding group of sections and any portion of the aggregate data width of the group of sections which exceeds the corresponding section bit width remains unused at the MSB end of the last section of the group of sections. This configuration is illustrated in FIG. 9, wherein M segments (e.g., segment 1, segment 2, . . . segment M) of different data widths are hosted by corresponding groups of sections of shifter stage 820.

As shown in the example of FIG. 9, the N_1 number of bits of message X_1 is less than the section data width W (e.g., N_1=10 and W=16), and thus the group of sections hosting segment 1 comprises section 1, wherein the LSB of message X_1 aligns with the LSB position of section 1 and a portion of the data width of section 1 greater than the number of bits of message X_1 remains unused (e.g., (1*16)−10=6 unused bits). Each shifter data path of section 1 of embodiments is controlled using same control signals. Thus a single instance of control signals is used to provide data shifting for segment 1 (e.g., as opposed to 10 separate data shift path control signals as may be implemented by examples shown above).

In contrast to exemplary message X_1, the N_2 number of bits of message X_2 is greater than the section data width W (e.g., N_2=38 and W=16), and thus the group of sections hosting segment 2 comprises section 2, section 3, and section 4 (e.g., CEILING.MATH(38/16)=3 sections), wherein the LSB of message X_2 aligns with the LSB position of section 2 (the first section of the segment) and a portion of the aggregate data width of the sections greater than the number of bits of message X_2 remains unused in section 4 (the last section hosting the segment) (e.g., (3*16)−38=10 unused bits). Each shifter data path of section 2 of embodiments is controlled using same control signals, each shifter data path of section 3 of embodiments is controlled using same control signals, and each shifter data path of section 4 of embodiments is controlled using same control signals. Thus 3 instances of control signals (e.g., an instance of control signals for each section hosting the segment) are used to provide data shifting for segment 2 (e.g., as opposed to 38 separate data shift path control signals as may be implemented by examples shown above).

The N_M number of bits of message X_M is an integer multiple of the section data width W (e.g., N_M=32 and W=16), and thus the group of sections hosting segment M comprises section Se-2 and section Se-1 (e.g., CEILING.MATH(32/16)=2 sections), wherein the LSB of message X_M aligns with the LSB position of section Se-2 (the first section of the segment) and the MSB of message X_M aligns with the MSB position of section Se-1 (the last section hosting the segment) (e.g., (2*16)− 32=0 unused bits). Each shifter data path of section Se-2 of embodiments is controlled using same control signals and each shifter data path of section Se-1 of embodiments is controlled using same control signals. Thus 2 instances of control signals (e.g., an instance of control signals for each section hosting the segment) are used to provide data Shifting for segment M (e.g., as opposed to 32 separate data shift path control signals as may be implemented by examples shown above).

As can be appreciated from the above, sectioned embodiments of a reconfigurable segmented scalable shifter may combine a plurality of successive sections to form a data shifter for accommodating data widths larger than the individual sections. Such reconfigurable segmented scalable shifter configurations provide for fully reconfigurable data width and shift command of each message of input data and are well suited for use with respect to embodiments of parallel LDPC decoder 200. For example, in operation of a receiver in a 5G network (e.g., implementing 5G BG1), if N=24 and W=16, then parallel LDPC decoder 200 of embodiments can simultaneously decoding 24 code blocks with lifting parameter Z≤16.

It should be appreciated that the sectioned reconfigurable segmented scalable Shifter configuration of FIG. 9 is exemplary of shifter cores as may be utilized by embodiments of parallel LDPC decoders implemented in accordance with concepts of the present invention. Accordingly, parallel LDPC decoders of embodiments of the invention may be constructed with different shifter cores.

Figure 10A:
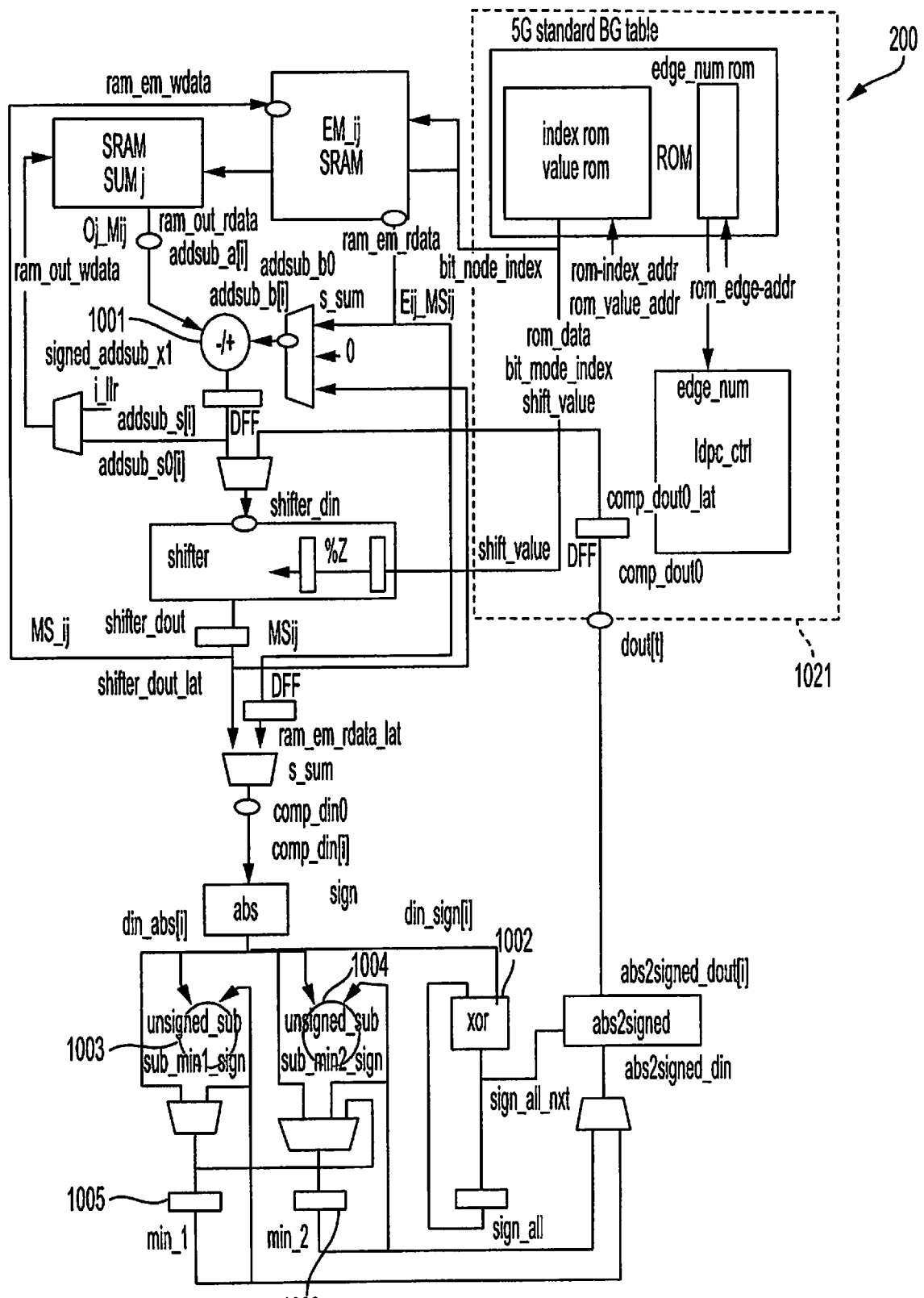
FIGS. 10A-10C show detail with respect to an implementation of a parallel LDPC decoder of embodiments of the present invention.
Figure 10B:
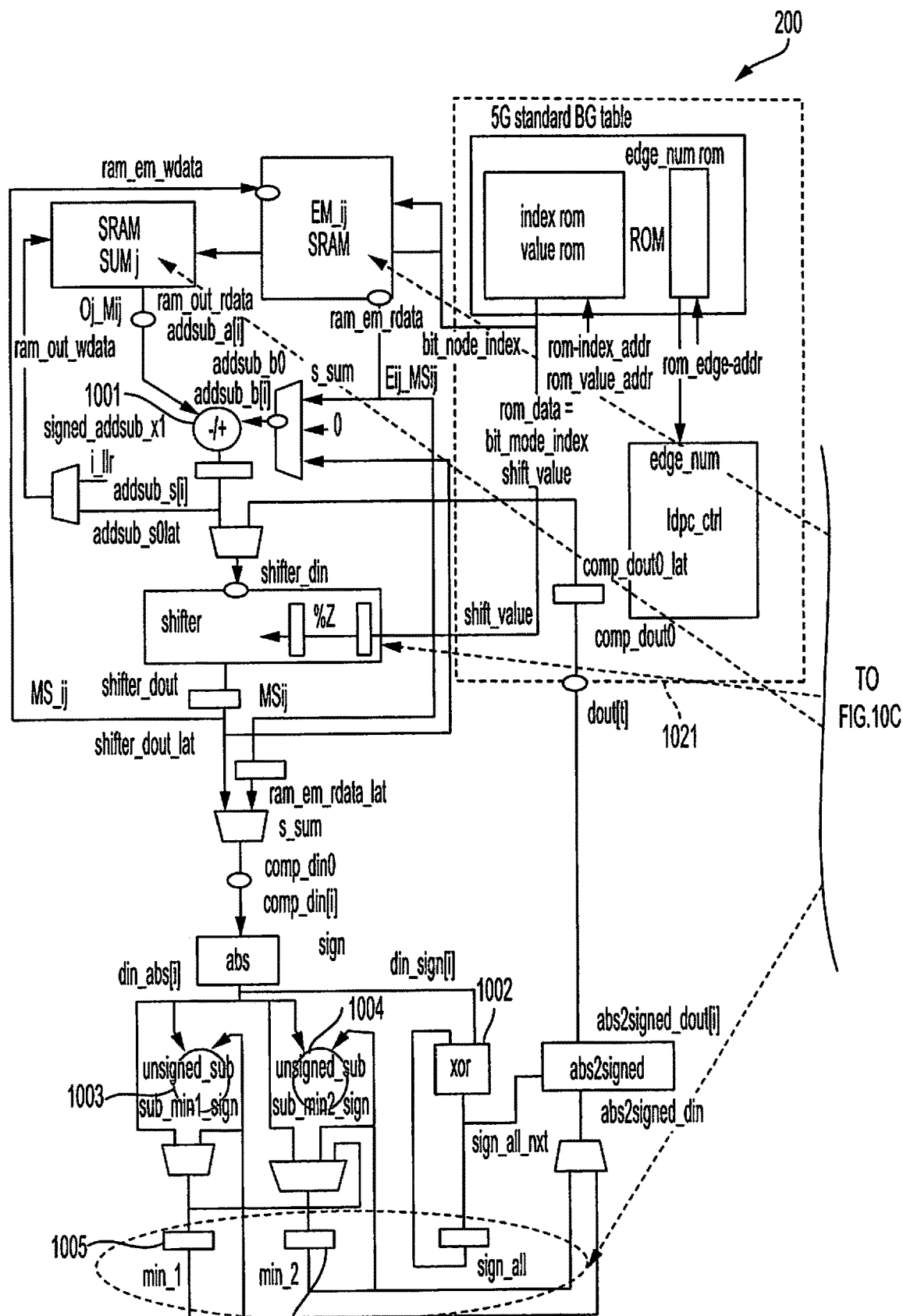
Figure 10C:
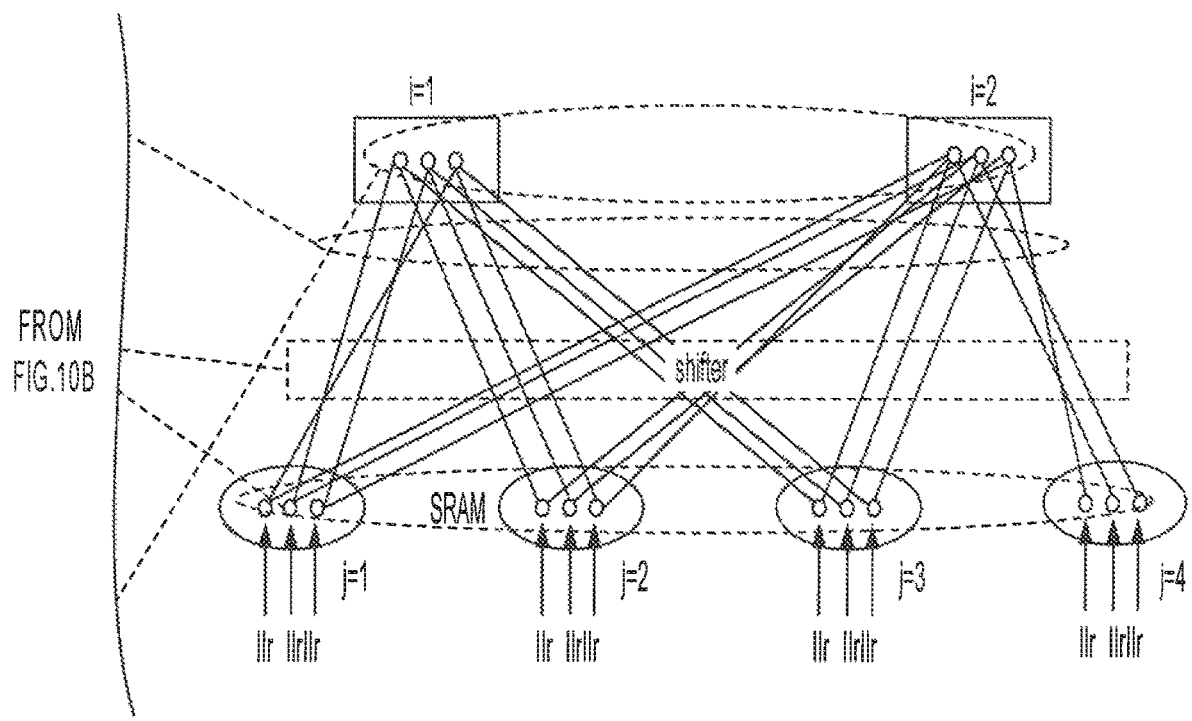

FIGS. 10A-10C show detail with respect to an implementation of parallel LDPC decoder 200 having a reconfigurable segmented scalable shifter core configured for decoding multiple code blocks in parallel in accordance with concepts of the present invention. Parallel LDPC decoder 200 shown in FIGS. 10A and 10B may, for example, be configured for use with respect to a receiver in a 5G network, and thus may accommodate decoding of code blocks having various lifting parameter sizes up to lifting parameter Z=384. In such a configuration of embodiments, each connection in the data path carries 384 soft messages. Likewise, various of the components in the embodiment of parallel LDPC decoder 200 shown in FIGS. 10A and 10B may be appropriately scaled. For example, embodiments of parallel LDPC decoder 200 may comprise 384 instances of adder/subtractor logic 1001, corresponding to a largest accommodated lifting parameter Z=384.

Parallel LDPC decoder 200 of the illustrated embodiment utilizing the min-sum algorithm in decoding code blocks. As may be more readily seen in the illustration of parallel LIPC decoder 200 annotated with a Tanner graph in FIGS. 10B and 10C, logic of the LDPC decoder may determine a first minimum with respect to the messages passed from the VNs connected to a CN and a second minimum with respect to the messages passed from the VNs connected to the CN (e.g., the first min calculated by unsigned_sub block 1003, with the first min stored in min_1 register 1005, and unsigned_sub block 1004 used to calculate the second min, with the second min stored in min_2 register 1006), wherein logic of the LDPC decoder (e.g., using XOR gate logic 1002) may further determine a sign for the messages passed from the VNs connected to the CN. The messages passed from the connected VNs may be computed by logic of the LDPC decoder (e.g., using adder/subtractor logic 1001) from the data previously provided in the messages passed from the CN in a prior iteration of the decoding. Correspondingly, logic of the LDPC decoder may determine a magnitude with respect to the messages passed from a CN to the connected VNs (e.g., calculated by unsigned_sub block 1003 and unsigned_sub block 1004). Logic of the LDPC decoder (e.g., using XOR gate logic 1002) may further determine a sign for the messages passed from the CN to the connected VNs. The messages passed from the CN may be used by logic of the LDPC decoder (e.g., using adder/subtractor logic 1001) in computing a message to be provided to the CN in a V2C operation in a subsequent iteration of the decoding. It can be appreciated from the foregoing, that the illustrated embodiment of parallel LDPC decoder 200 utilizes shared elements (e.g., adder/subtractor logic 1001, XOR logic 1002, shifter 1040, etc.) for both min and sum stages of the min-sum algorithm.

It can be appreciated from the foregoing that parallel LDPC decoders provided in accordance with concepts of the present invention provide efficient and flexible designs for parallel decoding of a plurality of code blocks. The table below provides a comparison of traditional LDPC decoders (e.g., traditional LDPC decoder 100 of FIG. 1) and parallel LDPC decoders of embodiments of the invention (e.g., parallel LDPC decoder 200 of FIG. 2). For the same algorithm and the same decoding process of a QC-LDPC decoder design, the delay, the latency and the number of clock cycles required for the decoding process is the same for all the cases. However, the multiple code block decoding processing provided by a parallel LDPC decoder of embodiments of the invention can support more users than the traditional design, thus facilitating more efficient decoding operation, such as by a 5G receiver or other communication equipment.

| Lifting Parameter Size (Z) | Traditional LDPC Decoder Inputs Decoding | Parallel LDPC Decode Inputs Decoding in Parallel |
| --- | --- | --- |
| 384 | 1 | 1 |
| 192 | 1 | 2 |
| 96 | 1 | 4 |
| ... | ... | ... |
| 16 | 1 | 24 |
| ... | ... | ... |
| 2 | 1 | 192 |

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
a parallel low-density parity-check (LDPC) decoder having a largest accommodated lifting parameter size of Z and the LDPC decoder is configured to simultaneously decode multiple code blocks input to the LDPC decoder, wherein a lifting parameter size of each code block of the multiple code blocks simultaneously decoded by the LDPC decoder is reconfigurable, and wherein a sum of the lifting parameter size of each code block of the multiple code blocks as configured and reconfigured is less than or equal to Z.

2. The system of claim 1, wherein the LDPC decoder comprises:
a reconfigurable segmented scalable shifter stage configured to implement different data shifts for multiple data segments in parallel; and
a controller coupled to the reconfigurable segmented scalable shifter stage and configured to provide control signal input to the reconfigurable segmented scalable shifter stage, wherein the control signal input controls configuration of the reconfigurable segmented scalable shifter stage to include a plurality of active regions corresponding to respective code blocks of the plurality of code blocks to be decoded in parallel.

3. The system of claim 2, wherein the reconfigurable segmented scalable shifter stage comprises:
a segmented cyclic shifter configured to support multiple data entry into segments and independently shift each segment when passing messages between check nodes and variable nodes of the parallel LDPC decoder.

4. The system of claim 3, wherein the independently shifting each segment provides different shift values for segments of the segmented cyclic shifter.

5. The system of claim 3, wherein the segmented cyclic shifter comprises a logarithmic shifter configuration.

6. The system of claim 3, wherein the segmented cyclic shifter comprises a data width greater than or equal to the largest lifting parameter size Z accommodated by the parallel LDPC decoder.

7. The system of claim 6, wherein Z=384.

8. The system of claim 3, wherein the segmented cyclic shifter comprises:
a sectioned shifter having a plurality of sections, wherein each data path of a section shares a same shift value and same control signals.

9. The system of claim 8, wherein each section of the plurality of sections is of data width size Se, and wherein code blocks of the multiple code blocks utilizing a lifting parameter size of less than Se occupy one section of the plurality of sections in decoding operation and code blocks of the multiple code blocks utilizing a lifting parameter size of more than Se occupy multiple sections of the plurality of sections.

10. The system of claim 9, wherein Se=16.

11. The system of claim 1, wherein each code block of the multiple code blocks decoded by the LDPC decoder in parallel comprise a same size code block.

12. The system of claim 1, wherein the multiple code blocks as input to the parallel LDPC decoder for decoding in parallel comprise code blocks formed from a combination of code blocks that use a same BG matrix index.

13. A method comprising:
inputting, to a parallel low-density parity-check (LDPC) decoder having a largest accommodated lifting parameter size of Z, multiple code blocks in parallel for LDPC decoding, wherein a sum of a lifting parameter size of each code block of the multiple code blocks is less than or equal to Z;

decoding, using the parallel LDPC decoder, the multiple code blocks simultaneously, wherein lifting parameter sizes of each code block decodable in parallel by the LDPC decoder is reconfigurable; and outputting, by the parallel LDPC decoder, decoded instances of the multiple code blocks.

14. The method of claim 13, further comprising:

configuring a reconfigurable segmented scalable shifter stage of the parallel LDPC decoder to implement different data shifts for multiple data segments in parallel; and providing, by a controller coupled to the reconfigurable segmented scalable shifter stage, control signal input to the reconfigurable segmented scalable shifter stage, wherein the control signal input controls configuration of the reconfigurable segmented scalable shifter stage to include a plurality of active regions corresponding to respective code blocks of the plurality of code blocks to be decoded in parallel.

15. The method of claim 14, wherein the reconfigurable segmented scalable shifter stage comprises a segmented cyclic shifter, the method comprising:

independently shifting each segment when passing messages between check nodes and variable nodes of the parallel LDPC decoder.

16. The method of claim 15, wherein the independently shifting each segment provides different shift values for segments of the segmented cyclic shifter.

17. The method of claim 15, wherein the segmented cyclic shifter comprises a data width greater than or equal to the largest lifting parameter size Z accommodated by the parallel LDPC decoder.

18. The method of claim 15, wherein the segmented cyclic shifter comprises a sectioned shifter having a plurality of sections, wherein each section of the plurality of sections is of data width size Se, and wherein code blocks of the multiple code blocks utilizing a lifting parameter size of less than Se occupy one section of the plurality of sections in decoding operation and code blocks of the multiple code blocks utilizing a lifting parameter size of more than Se occupy multiple sections of the plurality of sections.

19. The method of claim 13, wherein each code block of the multiple code blocks decoded by the LDPC decoder in parallel comprise a same size code block.

20. The method of claim 13, wherein the multiple code blocks as input to the parallel LDPC decoder for decoding in parallel comprise code blocks formed from a combination of code blocks that use a same BG matrix index.

21. A parallel low-density parity-check (LDPC) decoder configured to simultaneously decode multiple code blocks, the parallel LDPC decoder comprising:

a reconfigurable segmented scalable shifter stage configured to implement multiple individual different data shifts by multiple data segments processing the multiple code blocks in parallel, wherein the reconfigurable segmented scalable shifter stage has a largest accommodated lifting parameter size of Z, wherein a lifting parameter size of each code block of the multiple code blocks decoded simultaneously is reconfigurable, and wherein a sum of the lifting parameter size of each code block of the multiple code blocks as configured and reconfigured is less than or equal to Z.

22. The parallel LDPC decoder of claim 21, further comprising:

a controller coupled to the reconfigurable segmented scalable shifter stage and configured to provide control signal input to the reconfigurable segmented scalable shifter stage, wherein the control signal input controls configuration of the reconfigurable segmented scalable shifter stage to include a plurality of active regions corresponding to respective code blocks of the multiple code blocks to be decoded in parallel.

23. The parallel LDPC decoder of claim 21, wherein the reconfigurable segmented scalable shifter stage comprises:

a segmented cyclic shifter configured to support multiple data entry into segments and independently shift each segment when passing messages between check nodes and variable nodes of the parallel LDPC decoder.

24. The parallel LDPC decoder of claim 23, wherein independently shifting each segment provides different shift values for segments of the segmented cyclic shifter.

25. The parallel LDPC decoder of claim 21, wherein the reconfigurable segmented scalable shifter stage comprises:

a sectioned shifter having a plurality of sections, wherein each data path of a section shares a same shift value and same control signals.

26. The parallel LDPC decoder of claim 25, wherein each section of the plurality of sections is of data width size Se, and wherein code blocks of the multiple code blocks utilizing a lifting parameter size of less than Se occupy one section of the plurality of sections in decoding operation and code blocks of the multiple code blocks utilizing a lifting parameter size of more than Se occupy multiple sections of the plurality of sections.

* * * * *

UNITED STATES PATENT AND TRADEMARK OFFICE
CERTIFICATE OF CORRECTION

PATENT NO. : 10,826,529 B2
APPLICATION NO. : 16/264161
DATED : November 3, 2020
INVENTOR(S) : Hing-Mo Lam et al.

Page 1 of 1

It is certified that error appears in the above-identified patent and that said Letters Patent is hereby corrected as shown below:

In the Specification

At Column 1, Line number 32, delete "duller" and replace with --differ--.
At Column 2, Line number 7, delete "WPC" and replace with --LDPC--.
At Column 2, Line number 64, delete "WPC" and replace with --LDPC--.
At Column 3, Line number 28, delete "with, the" and replace with --with the--.
At Column 5, Line number 46, delete "BO matrix" and replace with --BG matrix--.
At Column 6, Line number 40, delete "$CN_s$" and replace with --$CN_i$--.
At Column 7, Line number 39, delete "abs(M11) 1=min_1" and replace with --abs(M11) !=min_1--.
At Column 8, Line number 1, delete "cheek nodes" and replace --check nodes--.
At Column 8, starting at Line number 7, delete "invention in" and replace with --invention. In--.
At Column 8, Line number 54, delete "decode the codes" and replace with --decode the LDPC codes--.
At Column 8, Line number 58, delete "parameter Z-1" and replace with --parameter Z=1--.
At Column 11, Line number 60, delete "N_m)" and replace with --(N_m)--.
At Column 12, Line number 61, delete "shifting direction and shift value)" and replace with --shifting (e.g. direction and shift value)--.
At Column 13, Line number 6, delete "data shilling" and replace with --data shifting--.
At Column 14, Line number 11, delete "Shifting" and replace with --shifting--.
At Column 14, Line number 27, delete "Shifter" and replace with --shifter--.
At Column 14, Line number 52, delete "LIPC" and replace with --LDPC--.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*